(12) United States Patent
Lee

(10) Patent No.: US 11,750,942 B2
(45) Date of Patent: Sep. 5, 2023

(54) IMAGE SENSOR, AN IMAGING DEVICE AND A METHOD OF OPERATING THE SAME

(71) Applicant: SAMSUNG ELECTRONICS CO., LTD., Suwon-si (KR)

(72) Inventor: Jaekyu Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/577,566

(22) Filed: Jan. 18, 2022

(65) Prior Publication Data

US 2023/0007192 A1 Jan. 5, 2023

(30) Foreign Application Priority Data

Jul. 1, 2021 (KR) ........................ 10-2021-0086455

(51) Int. Cl.
| | |
|---|---|
| *H04N 25/531* | (2023.01) |
| *H04N 25/75* | (2023.01) |
| *H04N 25/771* | (2023.01) |
| *H01L 27/146* | (2006.01) |
| *H04N 25/71* | (2023.01) |

(52) U.S. Cl.
CPC ........... *H04N 25/531* (2023.01); *H04N 25/75* (2023.01); *H04N 25/771* (2023.01); *H01L 27/1463* (2013.01); *H01L 27/14621* (2013.01); *H01L 27/14627* (2013.01); *H01L 27/14645* (2013.01); *H04N 25/745* (2023.01)

(58) Field of Classification Search
CPC .... H04N 25/531; H04N 25/75; H04N 25/771; H04N 25/745; H01L 27/14621; H01L 27/14627; H01L 27/1463; H01L 27/14645
See application file for complete search history.

(56) References Cited

U.S. PATENT DOCUMENTS

| | | | |
|---|---|---|---|
| 8,710,419 B2 | 4/2014 | Bogaerts | |
| 9,692,997 B2 | 6/2017 | Hseih et al. | |
| 10,412,326 B2 * | 9/2019 | Geurts | .............. H04N 25/75 |
| 10,757,350 B2 | 8/2020 | Tashiro et al. | |
| 11,019,286 B2 | 5/2021 | Shim et al. | |

(Continued)

FOREIGN PATENT DOCUMENTS

JP 2006-237944 9/2006

*Primary Examiner* — Nhan T Tran
(74) *Attorney, Agent, or Firm* — F. Chau & Associates, LLC

(57) ABSTRACT

An image sensor including: first and second capacitors; a first transistor between a photodiode and a floating diffusion node, and receiving a transfer signal; a second transistor between a first power terminal and the floating diffusion node and receiving a reset signal; a third transistor between a second power terminal and a first node and having a gate connected to the floating diffusion node; a fourth transistor between the first node and a column line and receiving a precharge signal; a fifth transistor between the first capacitor and a feedback node and receiving a first sampling signal; a sixth transistor between the second capacitor and feedback node and receiving a second sampling signal; a seventh transistor between the first node and feedback node and receiving a first switch signal; and an eighth transistor between the floating diffusion and feedback nodes and receiving a second switch signal.

20 Claims, 28 Drawing Sheets

(56) References Cited

U.S. PATENT DOCUMENTS

2019/0075259 A1* 3/2019 Geurts .................. H04N 25/53
2020/0195863 A1   6/2020 Shim et al.
2021/0152771 A1* 5/2021 Parks ..................... H04N 23/73
2021/0235027 A1* 7/2021 Meynants .............. H04N 25/79
2022/0070395 A1* 3/2022 Tang ................ H01L 27/14612

* cited by examiner

| R | G |
|---|---|
| G | B |

FIG. 14A

| G | G | R | R |
|---|---|---|---|
| G | G | R | R |
| B | B | G | G |
| B | B | G | G |

FIG. 14B

| G | G | G | G | R | R | R | R |
|---|---|---|---|---|---|---|---|
| G | G | G | G | R | R | R | R |
| G | G | G | G | R | R | R | R |
| G | G | G | G | R | R | R | R |
| B | B | B | B | G | G | G | G |
| B | B | B | B | G | G | G | G |
| B | B | B | B | G | G | G | G |
| B | B | B | B | G | G | G | G |

FIG. 14C

| B | G | B | G |
|---|---|---|---|
| IR | R | IR | R |
| B | G | B | G |

FIG. 14D

IMAGE SENSOR, AN IMAGING DEVICE AND A METHOD OF OPERATING THE SAME

CROSS TO REFERENCE TO RELATED APPLICATION

This application claims priority under 35 U.S.C. § 119 to Korean Patent Application No. 10-2021-0086455 filed on Jul. 1, 2021 in the Korean Intellectual Property Office, the disclosure of which is incorporated by reference herein in its entirety.

TECHNICAL FIELD

Example embodiments of the present disclosure relate to an image sensor, an imaging device and a method of operating the same.

DISCUSSION OF RELATED ART

A complementary metal oxide semiconductor (CMOS) image sensor may convert a charge from a photosensitive pixel to a voltage at the pixel site. The signal may then be multiplexed by row and column to multiple on-chip, digital-to-analog converters. The CMOS image sensor may be easily driven and may have a reduced size. A CMOS image sensor may also consume little power. In addition, CMOS process technology may be interchangeably used for a CMOS image sensor, thereby reducing manufacturing costs. Accordingly, the use of CMOS image sensors has rapidly increased.

SUMMARY

An example embodiment of the present disclosure provides an image sensor, an imaging device and a method of operating the same.

According to an example embodiment of the present disclosure, an image sensor includes: a first capacitor; a second capacitor; a first transistor connected between a photodiode and a floating diffusion node, and having a gate for receiving a transfer signal; a second transistor connected between a first power terminal and the floating diffusion node and having a gate for receiving a reset signal; a third transistor connected between a second power terminal and a first node and having a gate connected to the floating diffusion node; a fourth transistor connected between the first node and a column line and having a gate for receiving a precharge signal; a fifth transistor connected between the first capacitor and a feedback node and having a gate for receiving a first sampling signal; a sixth transistor connected between the second capacitor and the feedback node and having a gate for receiving a second sampling signal; a seventh transistor connected between the first node and the feedback node and having a gate for receiving a first switch signal; and an eighth transistor connected between the floating diffusion node and the feedback node and having a gate for receiving a second switch signal.

According to an example embodiment of the present disclosure, an imaging sensor including: a first capacitor; a second capacitor; a first transfer transistor connected between a first photodiode and a floating diffusion node, and having a gate for receiving a first transfer signal; a second transistor connected between a first power terminal and the floating diffusion node and having a gate for receiving a reset signal; a third transistor connected between a second power terminal and the first node and having a gate connected to the floating diffusion node; a fourth transistor connected between the first node and a ground terminal and having a gate for receiving a precharge signal; a first sampling transistor connected between the first capacitor and a feedback node, and having a gate for receiving a first sampling signal; a second sampling transistor connected between the second capacitor and the feedback node and having a gate for receiving a second sampling signal; a seventh transistor connected between the first node and the feedback node and having a gate for receiving a first switch signal; an eighth transistor connected between the floating diffusion node and the feedback node and having a gate for receiving a second switch signal; and a ninth transistor connected between the first node and a column line and having a gate for receiving a select signal.

According to an example embodiment of the present disclosure, a method of operating an image sensor includes: selecting one of a global shutter operation and a rolling shutter operation; dumping a reset voltage and a pixel voltage to corresponding capacitors via a source follower transistor in each pixel of the image sensor when performing the global shutter operation; and reading out the reset voltage and the pixel voltage stored in the capacitors in each of the pixels via the source follower transistor.

According to an example embodiment of the present disclosure, an image sensor includes: a pixel array having a plurality of pixels arranged in a plurality of row lines and a plurality of column lines; a row driver configured to select one of the plurality of row lines; an analog-to-digital conversion circuit configured to convert analog signals output by the pixel array into digital data; a digital clock generator configured to generate a transmission clock for transmitting the digital data to an image signal processor; and a timing controller configured to control timings of the pixel array, the row driver, the analog-to-digital conversion circuit, and the digital clock generator, wherein each of the plurality of pixels operates by a global shutter scheme using a single source-follower transistor.

According to an example embodiment of the present disclosure, an imaging device includes: an image sensor configured to receive image signals from a plurality of pixel groups connected to points at which row lines intersect column lines, to convert the received image signals into digital data, and to output the converted image data; and an image signal processor configured to process the image data and to output the processed image data, wherein each of the plurality of pixel groups includes a plurality of pixels, and wherein each of the plurality of pixels operates by a global shutter scheme using a single source-follower transistor.

BRIEF DESCRIPTION OF THE DRAWINGS

The above and other features of the present disclosure will be more clearly understood from the following detailed description, taken in conjunction with the accompanying drawings, in which:

FIG. 14A is a diagram illustrating a pixel configured in a 2×2 Bayer pattern;

FIG. 14B is a diagram illustrating a pixel configured in a 4×4 tetra pattern;

FIG. 14C is a diagram illustrating a pixel configured in a 8×8 Q-cell pattern;

FIG. 14D is a diagram illustrating a pixel including an IR sub-pixel;

DETAILED DESCRIPTION OF THE EMBODIMENTS

Hereinafter, example embodiments of the present disclosure will be described with reference to the accompanying drawings.

Figure 1:
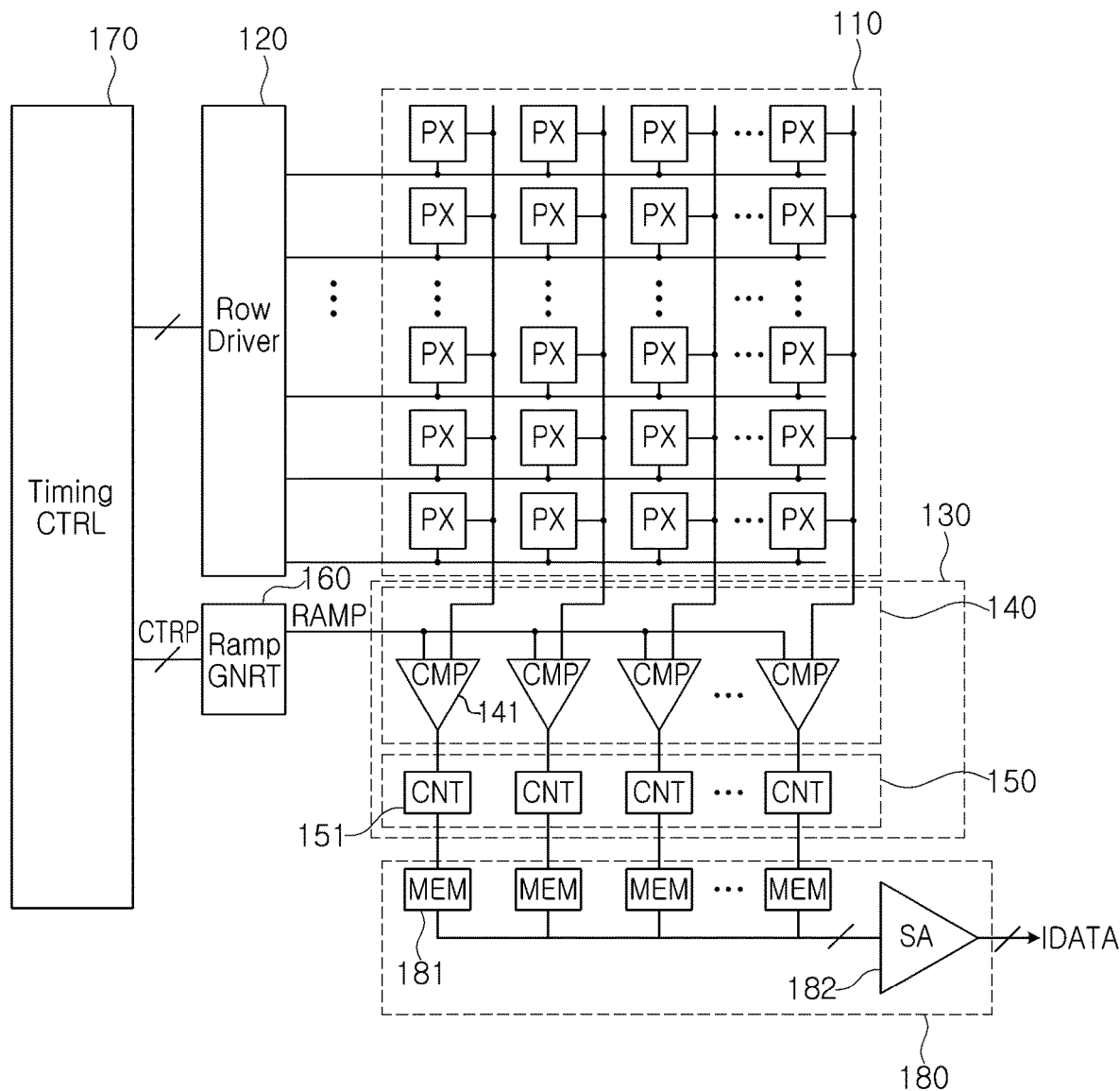
FIG. 1 is a diagram illustrating an image sensor according to an example embodiment of the present disclosure.

FIG. 1 is a diagram illustrating an image sensor 100 according to an example embodiment of the present disclosure. Referring to FIG. 1, the image sensor 100 may include a pixel array 110, a row driver 120, an analog-to-digital conversion circuit 130, a ramp voltage generator 160, a timing controller 170, and a buffer 180.

The pixel array 110 may include a plurality of pixels arranged in a matrix form, and each of the plurality of pixels may be connected to a plurality of row lines and a plurality of column lines. Each of the plurality of pixels may include a photosensing device. For example, the photosensing device may include a photodiode, a phototransistor, a port gate, or a pinned photodiode. Each of the plurality of pixels may include at least one photosensing device. In an example embodiment of the present disclosure, each of the plurality of pixels may include a plurality of photosensing devices. The plurality of photosensing devices may be stacked on each other.

Each of the plurality of pixels may sense light using a photosensing device and may convert light into a pixel signal which may be an electrical signal. Each of the plurality of pixels may detect light in a specific spectral region (or range). For example, the plurality of pixels may include a red pixel for converting light in a red spectrum region into an electrical signal, a green pixel for converting light in a green spectrum region into an electrical signal, and a blue pixel for converting light in a blue spectrum region into an electrical signal. A color filter for transmitting light in a specific spectral region may be disposed on each of the plurality of pixels.

Each of the plurality of pixels may be implemented to operate both a signal dump operation and a readout operation using a single source-follower transistor.

The row driver 120 may be implemented to drive the pixel array 110 in a row unit. The row driver 120 may decode a row control signal (e.g., an address signal) generated by the timing controller 170, and may select at least one of the row lines included in the pixel array 110 in response to the decoded row control signal. For example, the row driver 120 may generate a row select signal. In addition, the pixel array 110 may output a pixel signal from a row selected by the row select signal provided by the row driver 120. The pixel signal may include a reset signal and an image signal.

The analog-to-digital conversion circuit 130 may be implemented to convert an analog pixel signal input from the pixel array 110 into digital data in response to an activation signal. The analog-to-digital conversion circuit 130 may include a comparator circuit 140 and a counter circuit 150.

The comparator circuit 140 may be implemented to compare a pixel signal output by a unit pixel connected to one of the column lines included in the pixel array 110 with a ramp voltage RAMP. The comparator circuit 140 may include a plurality of comparators 141 provided to correspond to each column of the pixel array 110. Each comparator 141 may be connected to the pixel array 110 and the ramp voltage generator 160.

The comparator 141 (CMP) may be implemented to receive the pixel signal and the ramp voltage RAMP generated by the ramp voltage generator 160, to compare the pixel signal with the ramp voltage RAMP, and to output the comparison result signal to an output terminal. In addition, the comparator 141 may generate a comparison result signal to which a correlated double sampling (CDS) technique is applied. Pixel signals output by the plurality of pixels may have a deviation caused by unique characteristics (e.g., fixed pattern noise (FPN), or the like) of each pixel, or a deviation caused by a difference in characteristics of a logic for outputting a pixel signal from the pixel. The correlated double sampling technique may be used to calculate a reset component (or a reset signal) and an image component (or an image signal) for each of the pixel signals and to extract the difference as a valid signal component to compensate for the deviation between the pixel signals. The comparator 141 may output a comparison result signal to which the correlated double sampling technique is applied.

In addition, the comparator 141 may be implemented as a two-stage amplifier. For example, the comparator 141 may include a first amplifier for comparing the pixel signal with the ramp voltage, and a second amplifier for amplifying and outputting the output of the first amplifier. In an example embodiment of the present disclosure, the first amplifier may operate based on a smaller amount of bias current in an auto-zero stage than in a comparison operation stage. Accordingly, the input range may increase as noise is reduced. In an example embodiment of the present disclosure, the second amplifier may adaptively control current sources generating a bias current for each operation stage, and may generate a minimum bias current before and after the decision. Accordingly, power supply fluctuations caused by the operation of the second amplifier may be prevented. In an example embodiment of the present disclosure, the first amplifier may include a limiting circuit for connecting an output terminal to a common node. Here, the limiting circuit may prevent the voltage level of the common node from being lowered to be below a minimum value at which the first amplifier may normally operate, and may compensate for voltage fluctuations occurring in the output node.

In addition, the comparator circuit 140 may be implemented to output a decision signal (e.g., an output signal of a comparator) at different time points depending on column line groups.

The counter circuit 150 may include a plurality of counters. Each of the plurality of counters 151 (CNT) may be connected to an output terminal of the comparators 141 and may be implemented to count based on the output of each comparator 141. A counter control signal may include a counter activation signal, a counter clock signal, a counter reset signal for controlling a reset operation of the plurality of counters 151, and an inverting signal for inverting respective internal bits of each of the plurality of counters 151. The counter circuit 150 may output the digital data by counting a comparison result signal according to a counter clock signal.

The counter 151 (CNT) may include an up/down counter or a bit-wise counter. In this case, the bit-wise counter may perform an operation similar to that of the up/down counter. For example, the bit-wise counter may perform a function of only up-counting and a function of inverting all bits inside the counter into a 1's complement in response to receiving a specific signal. The bit-wise counter may perform a reset count and may invert the count into a 1's complement, in other words, a negative value.

The ramp voltage generator 160 may be implemented to generate a ramp voltage RAMP (or a reference voltage). The ramp voltage generator 160 may operate based on a ramp control signal CTRP provided by the timing controller 170. The ramp control signal CTRP may include a ramp enable signal, a mode signal, and the like. When the ramp enable signal is activated, the ramp voltage generator 160 may generate a ramp voltage RAMP having a slope determined based on the mode signal.

Timing controller 170 may be implemented to, by outputting a control signal or a clock signal to each of the row driver 120, the analog-to-digital conversion circuit 130, and the ramp voltage generator 160, control operations or timings of the row driver 120, the analog-to-digital conversion circuit 130, and the ramp voltage generator 160. In addition, the timing controller 170 may generate switching control signals provided to the comparator circuit 140 to allow decision speeds to be different depending on the column line groups.

The buffer 180 may be implemented to temporarily store, amplify and output digital data output by the analog-to-digital conversion circuit 130. The buffer 180 may include a column memory block 181 (MEM) and a sense amplifier circuit 182 (SA).

The column memory block 181 (MEM) may include a plurality of memories. Each of the plurality of memories may temporarily store digital data output by each of the plurality of counters 151 and may output the digital data to the sense amplifier circuit 182.

The sense amplification circuit 182 (SA) may be implemented to sense and amplify digital data output by a plurality of memories. The sense amplifier circuit 182 may output the amplified digital data as image data IDATA to an image signal processor.

The image sensor 100 in an example embodiment of the present disclosure may perform a signal dump operation and a readout operation using a single source-follower transistor. The image sensor 100 in an example embodiment of the present disclosure may implement a pixel having a single source-follower transistor connecting a switch transistor to a floating diffusion region, thereby reducing the area of the pixel and having excellent properties in terms of noise.

In general, a pixel driving method of the image sensor 100 may include a rolling shutter method and a global shutter scheme.

Figure 2A:
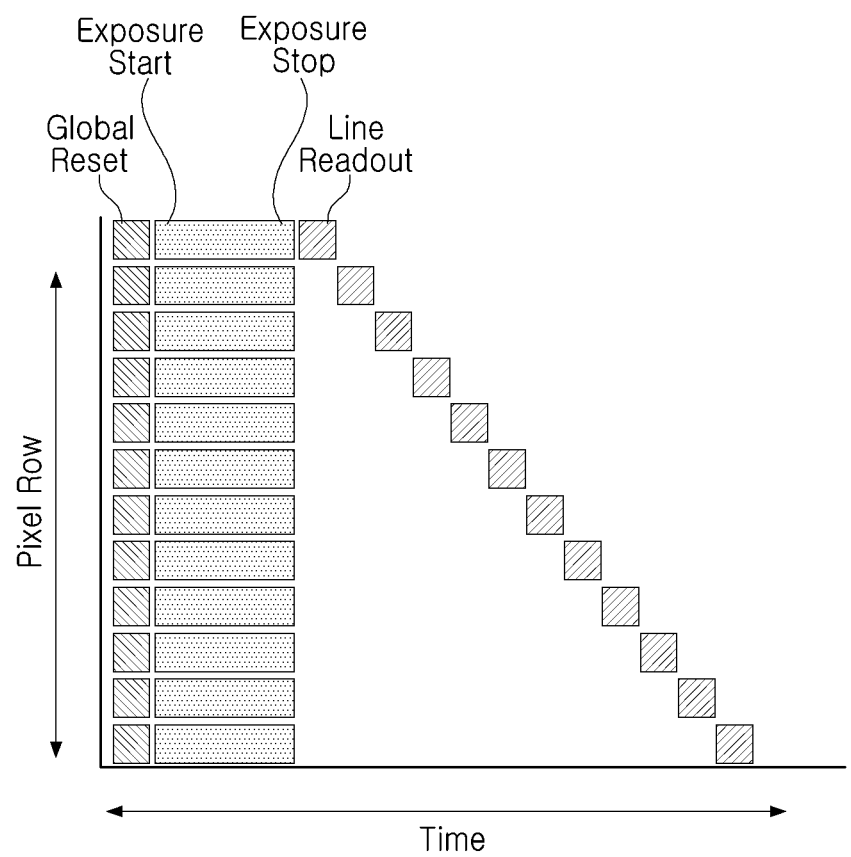
FIG. 2A is a diagram illustrating a global shutter scheme.
Figure 2B:
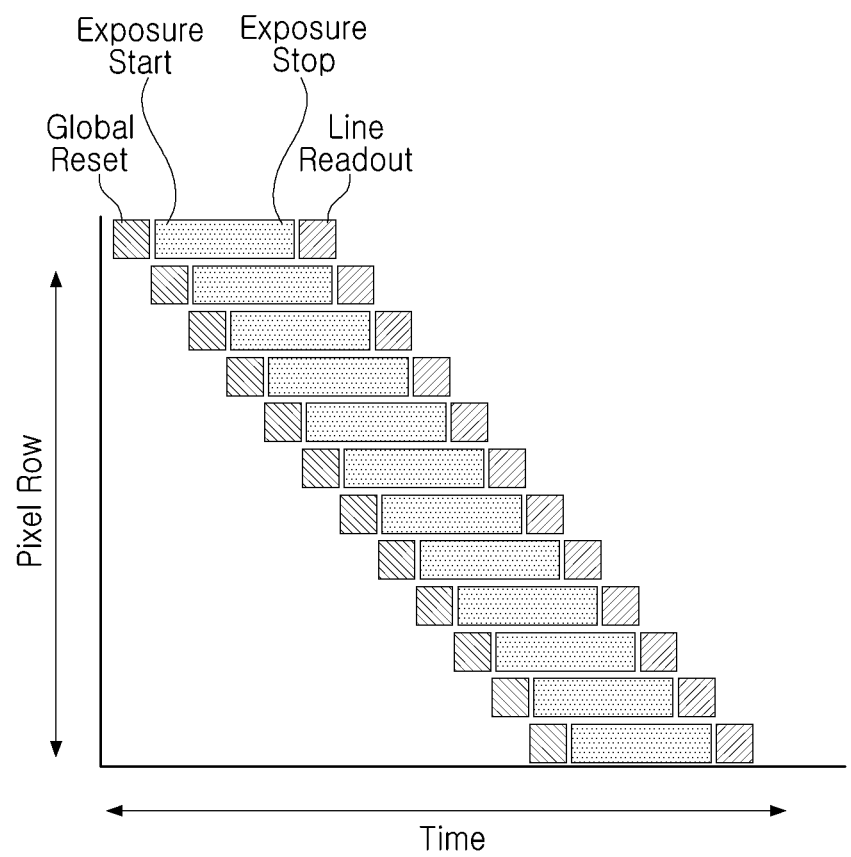
FIG. 2B is a diagram illustrating a rolling shutter method.

FIG. 2A is a diagram illustrating a global shutter scheme. FIG. 2B is a diagram illustrating a rolling shutter method. Referring to FIG. 2A, as for a global shutter operation, an entire signal photoelectrically converted by all optical devices in a single frame may be transferred to the floating diffusion node simultaneously, and an image signal of the corresponding pixel may be output by a row selected in sequence. Referring to FIG. 2B, as for the rolling shutter method, reset and readout operations may be performed in order by a line unit (or a row unit).

The pixel PX in an example embodiment of the present disclosure may be implemented as a single source-follower transistor configured to simultaneously perform global dump and readout operations.

Figure 3:
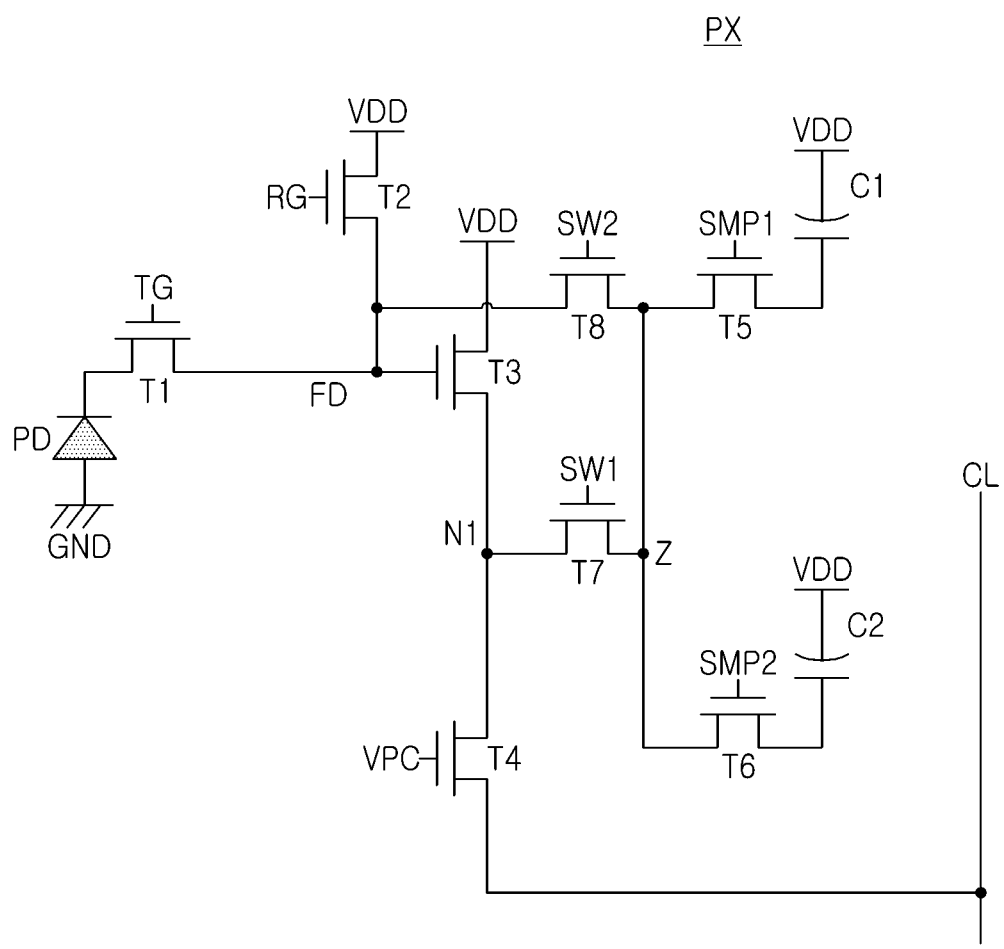
FIG. 3 is a diagram illustrating a pixel according to an example embodiment of the present disclosure.

FIG. 3 is a diagram illustrating a pixel PX according to an example embodiment of the present disclosure. Referring to FIG. 3, the pixel PX may include a photodiode PD, transistors T1 to T8, a first capacitor C1, and a second capacitor C2.

The first transistor T1 (or a transfer transistor) may be connected between the photodiode PD and a floating diffusion node FD and may include a gate for receiving a transfer signal TG.

The second transistor T2 (or a reset transistor) may be connected between a first power terminal and the floating diffusion node FD, and may include a gate for receiving a reset signal RG. The first power terminal (or stage) may receive a power supply voltage VDD.

The third transistor T3 (or a source follower transistor) may be connected between a second power terminal and a first node N1 and may include a gate connected to the floating diffusion node FD. The second power terminal (or stage) may receive the power supply voltage VDD. The third transistor T3 may perform a source follower function of outputting the voltage of the floating diffusion node FD. The first power terminal and the second power terminal illustrated in FIG. 3 may be provided with the same power supply voltage VDD. However, an example embodiment of the present disclosure is not limited thereto. For example, the first power terminal and the second power terminal may be provided with different power voltages.

The fourth transistor T4 (or a precharge transistor) may be connected between the first node N1 and a column line CL and may include a gate for receiving a precharge signal VPC. In an example embodiment of the present disclosure, the fourth transistor T4 may perform three functions. First, the fourth transistor T4 may perform a function of transferring the voltage of the first node N1 to the column line CL when a readout operation is performed. In this case, a precharge signal VPC of a first level may be input to the gate of the fourth transistor T4. Second, the fourth transistor T4 may perform a biasing function in a signal dump operation. In this case, a precharge signal VPC of a second level may be input to the gate of the fourth transistor T4. The second level may be lower than the first level. For example, the first level may be 3.7V and the second level may be 0.4V. Finally, the fourth transistor T4 may perform a turning on/off function for the column line CL. In this case, 0V may be input to the gate of the fourth transistor T4.

The fifth transistor T5 (or a first sampling transistor) may be connected to the first capacitor C1 and a feedback node Z, and may include a gate for receiving a first sampling signal SMP1.

The sixth transistor T6 (or a second sampling transistor) may be connected to the second capacitor C2 and the feedback node Z, and may include a gate for receiving a second sampling signal SMP2.

The seventh transistor T7 (or a first switch transistor) may be connected between the feedback node Z and the first node N1 and may include a gate for receiving a first switch signal SW1.

The eighth transistor T8 (or a second switch transistor) may be connected between the feedback node Z and the floating diffusion node FD, and may include a gate for receiving a second switch signal SW2.

One end of each of the first capacitor C1 (or a first storage unit) and the second capacitor C2 (or a second storage unit) may be connected to a power terminal VDD. In addition, the other ends of the first capacitor C1 and the second capacitor C2 may be connected to corresponding transistors T5 and T6. One end of each of the first and second capacitors C1 and C2 illustrated in FIG. 3 may be connected to a power terminal. However, an example embodiment of the present disclosure is not limited thereto. For example, one end of each of the first and second capacitors C1 and C2 may be connected to a ground terminal GND.

The pixel PX in an example embodiment of the present disclosure may perform a global signal dump operation and a rolling readout operation using a single source follower transistor T3.

Figure 4A:
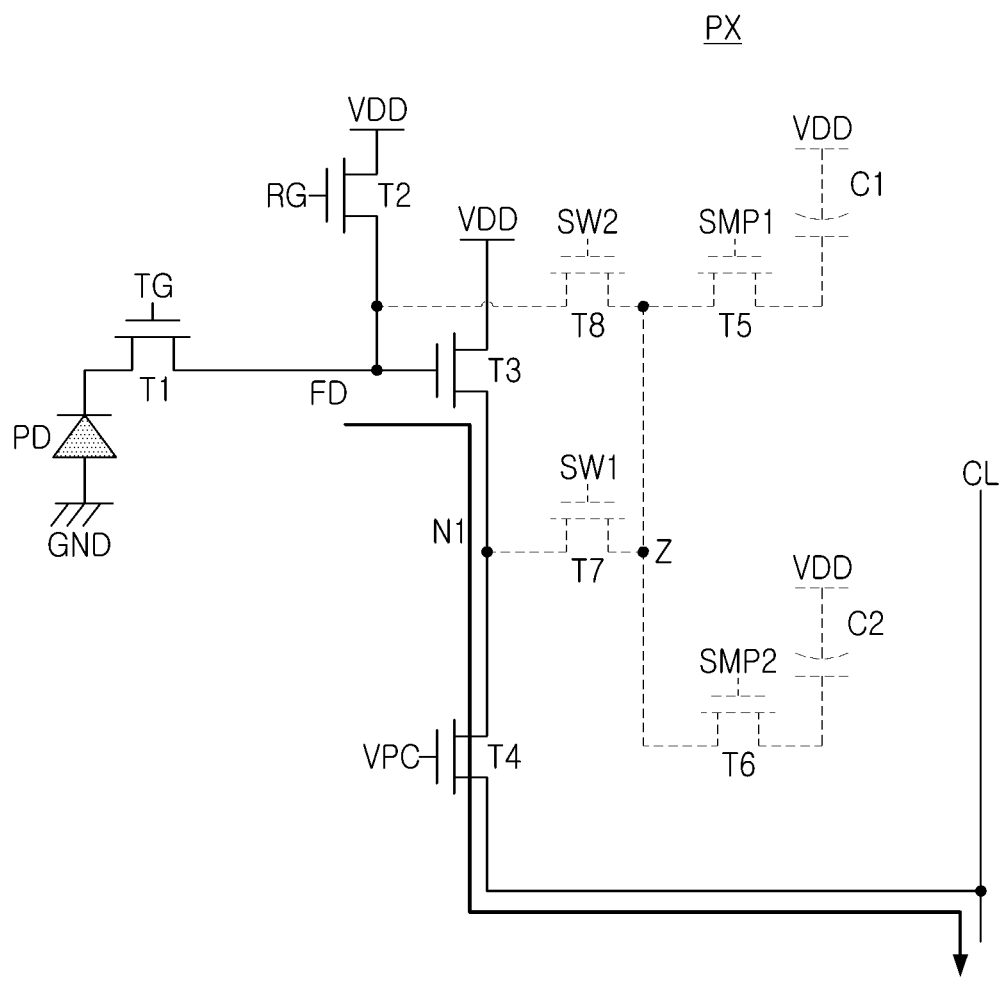
FIGS. 4A, 4B, and 4C are diagrams illustrating operations of a pixel according to an example embodiment of the present disclosure.
Figure 4B:
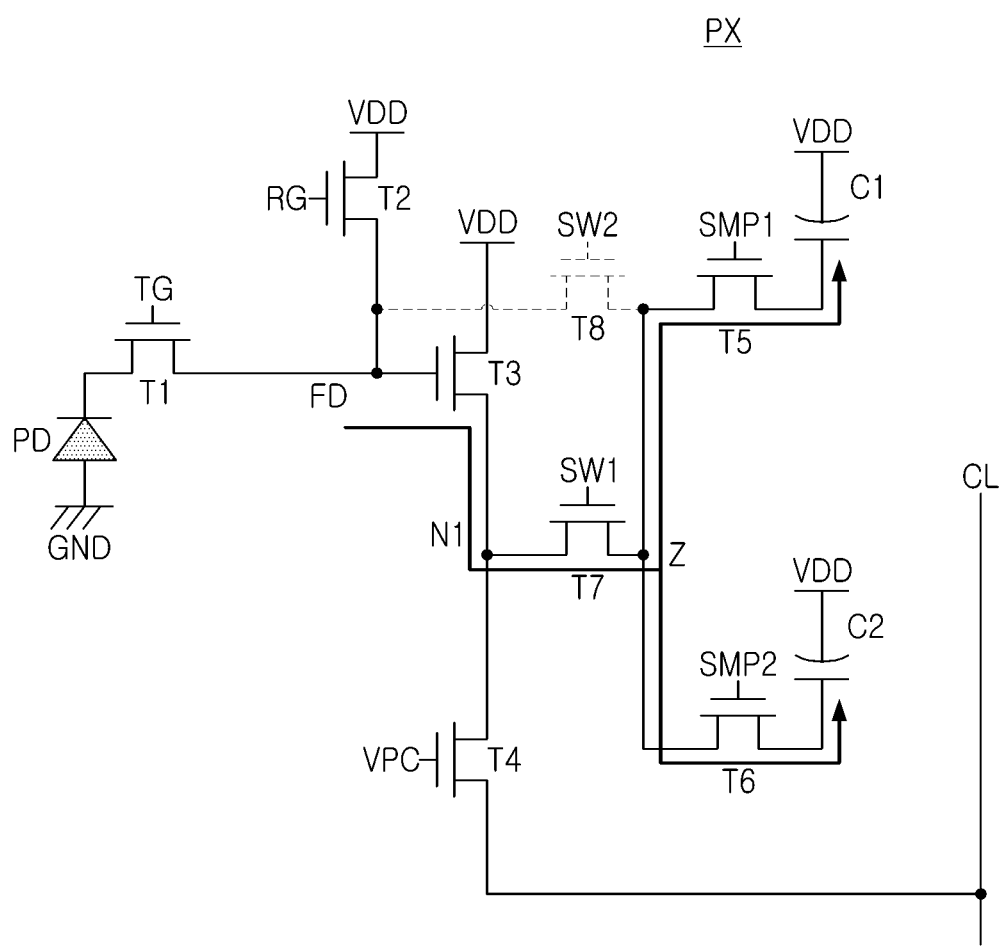
Figure 4C:
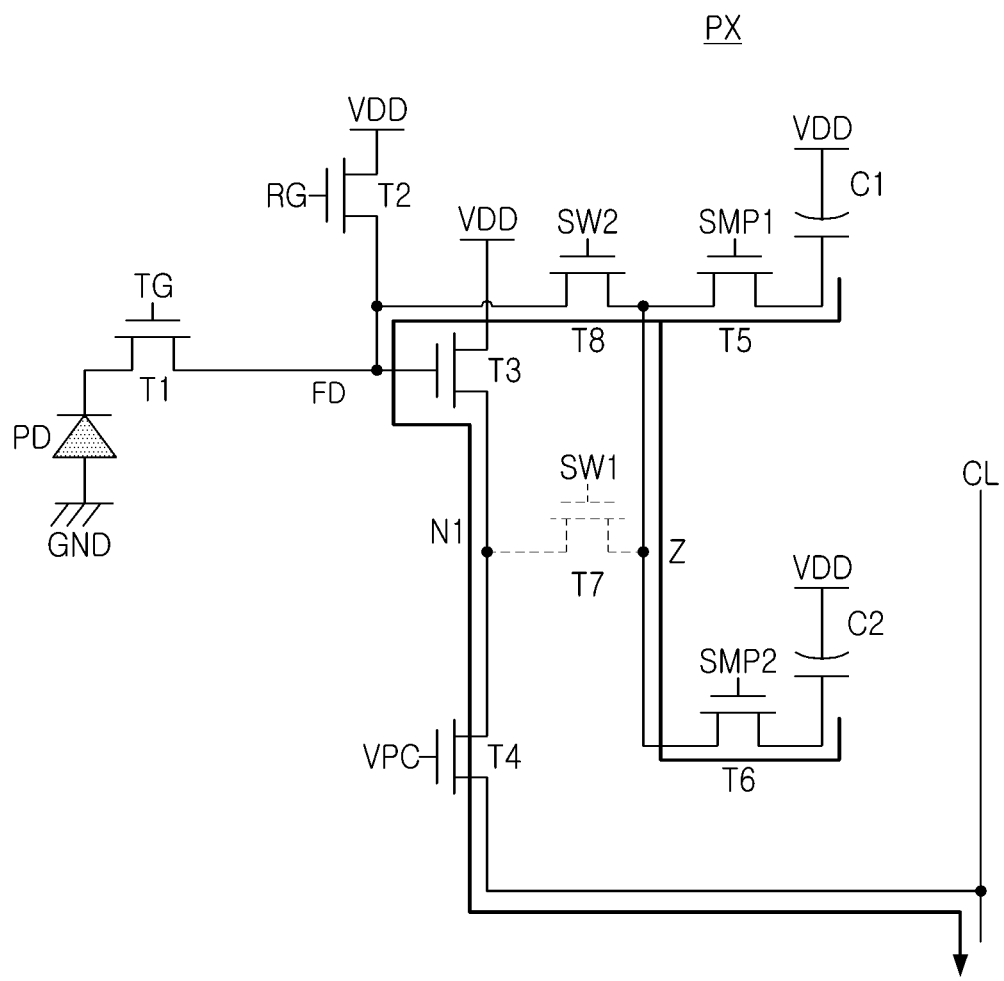

FIGS. 4A, 4B, and 4C are diagrams illustrating operations of a pixel PX according to an example embodiment of the present disclosure.

Referring to FIG. 4A, a pixel PX may perform a rolling shutter operation. The signal of the floating diffusion node FD may be transferred to a corresponding column line CL by the rolling shutter method. In this case, a storage unit of the pixel PX may be deactivated by the seventh and eighth transistors T7 and T8.

Referring to FIG. 4B, the pixel PX may perform a signal dump operation of a global shutter scheme. Charges of the floating diffusion node FD corresponding to the reset voltage may be stored in the first capacitor C1, and charges of the floating diffusion node FD corresponding to the pixel voltage may be stored in the second capacitor C2. For example, the charges of the floating diffusion node FD may pass from the third transistor T3, to the seventh transistor T7 and then to the fifth and sixth transistors T5 and T6. In this case, the transistor T8 may be turned off such that the feedback node Z of the pixel PX is not connected to the floating diffusion node FD. In this case, a voltage of the precharge signal VPC (for example, up to 0.4V) for maintaining biasing of the pixel PX may be applied to the gate of the transistor T4.

Referring to FIG. 4C, the pixel PX may perform a readout operation of a global shutter scheme. In a state in which the feedback node Z is connected to the floating diffusion node FD, the reset voltage stored in the first capacitor C1 and the pixel voltage stored in the second capacitor C2 may be read out to the corresponding column line CL in sequence. In this case, a voltage of the precharge signal VPC (for example, up to 3.7V) for transferring the voltage of the pixel PX to the column line CL may be applied to the gate of the transistor T4.

Figure 5:
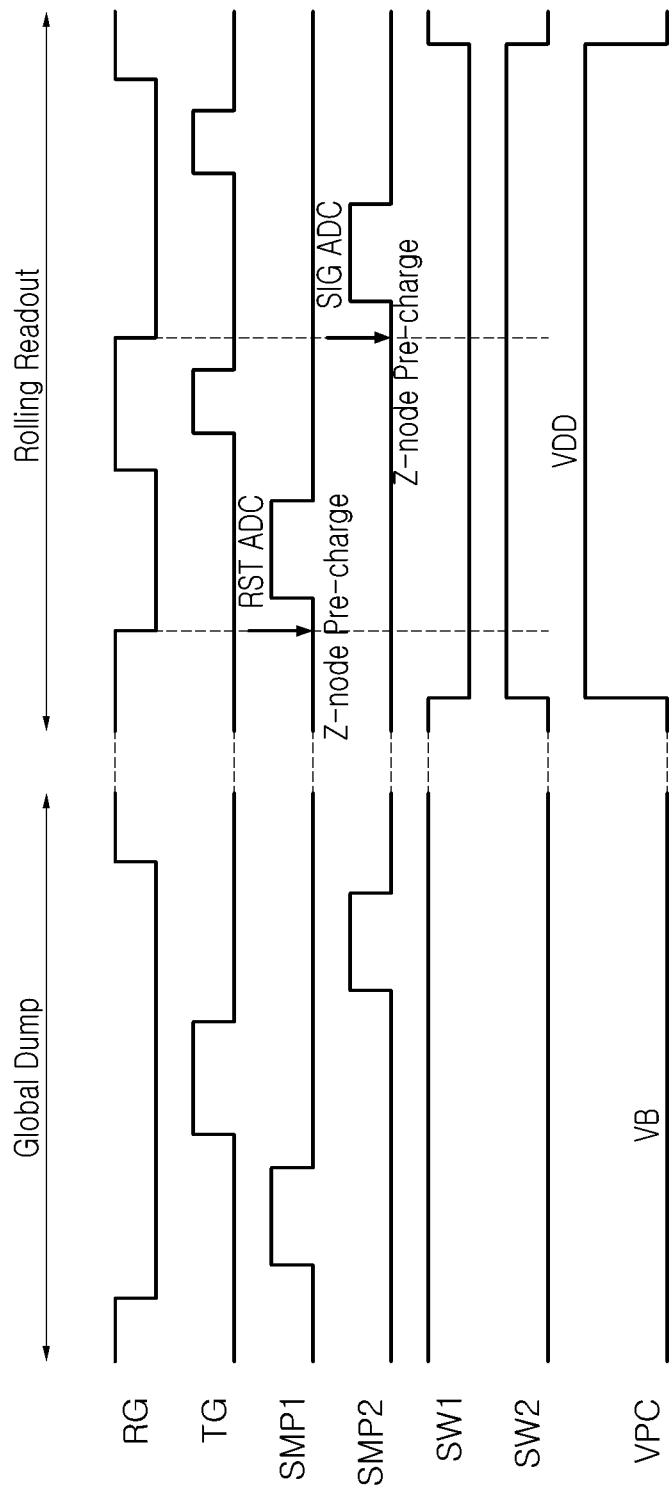
FIG. 5 is a timing diagram illustrating a method of operating a pixel according to an example embodiment of the present disclosure.

FIG. 5 is a timing diagram illustrating a method of operating a pixel PX according to an example embodiment of the present disclosure. Referring to FIG. 5, the operation of the pixel PX may be divided into a global signal dump operation and a rolling readout operation.

In the global signal dump operation, the first switch signal SW1 may have a high level and the second switch signal SW2 may have a low level. In other words, as the seventh transistor T7 is turned on by the first switch signal SW1 having a high level, the storage unit (see T5, T6, C1, and C2 in FIG. 3) may be connected to one end of the source follower transistor T3. In this case, the precharge signal VPC may have a level of a bias voltage VB for biasing the pixel PX. The bias voltage VB may be greater than 0V and lower than the power supply voltage VDD.

As illustrated in FIG. 5, the reset signal RG may have a high level and the transfer signal TG may maintain a low level state for a predetermined period in the global signal dump operation, such that the floating diffusion node FD may be charged with the reset voltage. Thereafter, since the first sampling signal SMP1 has a high level for a predetermined time, the reset voltage of the floating diffusion node FD may be amplified by the source follower transistor T3, and the amplified voltage may be stored in the first capacitor C1. Thereafter, the reset signal RG may have a low level and the transfer signal TG may maintain a high level for a predetermined period, such that the floating diffusion node FD may be charged with a pixel voltage by the charges transferred from the photodiode PD. Thereafter, as the second sampling signal SMP2 has a high level for a predetermined time, the pixel voltage of the floating diffusion node FD may be amplified by the source follower transistor T3, and the amplified voltage may be stored in the second capacitor C2. The above-described global signal dump operation may be performed on all of the rows of the pixel array 110 simultaneously.

Thereafter, a rolling readout operation may be performed for each of the rows of the pixel array 110. As illustrated in FIG. 5, in the rolling readout operation, the first switch signal SW1 may have a low level, and the second switch signal SW2 may have a high level. In other words, as the eighth transistor T8 is turned on by the high level second switch signal SW2, the storage units (see T5, T6, C1, and C2 in FIG. 3) may be connected to the floating diffusion node FD. In this case, to transfer data of the pixel PX, the precharge signal VPC may have a level of the power supply voltage VDD.

When the first switch signal SW1 has a low level, the second switch signal SW2 maintains a high level, and the reset signal RG changes from a high level to a low level, the feedback node Z may be precharged. Thereafter, the first sampling signal SMP1 may have a high level for a predetermined time. In this case, the reset voltage stored in the first capacitor C1 may be transferred to the floating diffusion node FD, the reset voltage of the floating diffusion node FD may be amplified by the source follower transistor T3, and the amplified voltage may be transferred to the corresponding column line CL by the fourth transistor T4. The reset voltage transferred to the column line CL may be converted into a digital value by a first analog-to-digital conversion operation RST ADC.

Thereafter, the reset signal RG may be in a high level state, and may be in a high level state by the transfer signal TG after a predetermined time. Accordingly, the floating diffusion node FD and the photodiode PD may be reset. In this case, since the second switch signal SW2 is in a high level state, the feedback node Z may be precharged (e.g., reset). Thereafter, the second sampling signal SMP2 may have a high level for a predetermined time. In this case, the pixel voltage stored in the second capacitor C2 may be transferred to the floating diffusion node FD, the pixel voltage of the floating diffusion node FD may be amplified by the source follower transistor T3, and the amplified voltage may be transferred to the corresponding column line CL by the fourth transistor T4. The pixel voltage transferred to the column line CL may be converted into a digital value by a second analog-to-digital conversion operation SIG ADC. Thereafter, the high level state may be obtained by the transfer signal TG after a predetermined time. Thereafter, the reset signal RC may have a high level.

Figure 6:
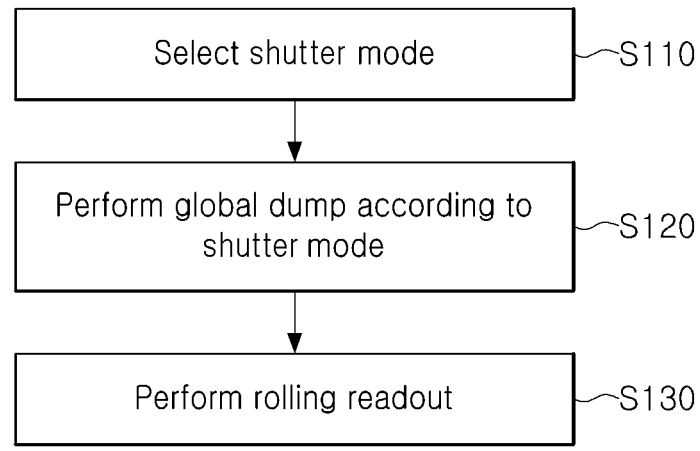
FIG. 6 is a flowchart illustrating a method of operating an image sensor according to an example embodiment of the present disclosure.

FIG. 6 is a flowchart illustrating a method of operating an image sensor according to an example embodiment of the present disclosure. Referring to FIGS. 1 to 6, a method of operating the image sensor 100 may include operations as below. The image sensor 100 may select a shutter mode (S110). The shutter mode may be one of a global shutter scheme and a rolling shutter method. When the shutter mode is the global shutter scheme, a global dump operation may be performed on the entire rows of the pixel array 110 (S120). For example, when performing a global shutter operation, the reset voltage and the pixel voltage may be dumped to corresponding first and second capacitors C1 and C2 (see FIG. 3) via the source follower transistor T3 (see FIG. 3) in each pixel. Thereafter, a rolling readout operation may be performed for each of the rows (S130). For example, the reset voltage and the pixel voltage stored in the first and second capacitors C1 and C2 in each of the pixels may be read out via the source follower transistor T3. The global signal dump operation and the rolling readout operation may be the same as that described with reference to FIG. 5.

In an example embodiment of the present disclosure, in the rolling shutter operation, the first and second capacitors C1 and C2 may be separated from the source follower transistor T3. In an example embodiment of the present disclosure, the current flowing through the source follower transistor T3 may be constantly biased in the global dumping operation. In an example embodiment of the present disclosure, when the rolling readout operation is performed, the gate of the source follower transistor T3 and the feedback node Z (see FIG. 3) may be connected to each other. In an example embodiment of the present disclosure, before outputting the voltages stored in the first and second capacitors C1 and C2 in the rolling readout operation, the feedback node Z may be precharged.

The pixel in an example embodiment of the present disclosure may further include a select transistor for isolating a biasing function of the signal dump operation and a function of the readout operation.

Figure 7:
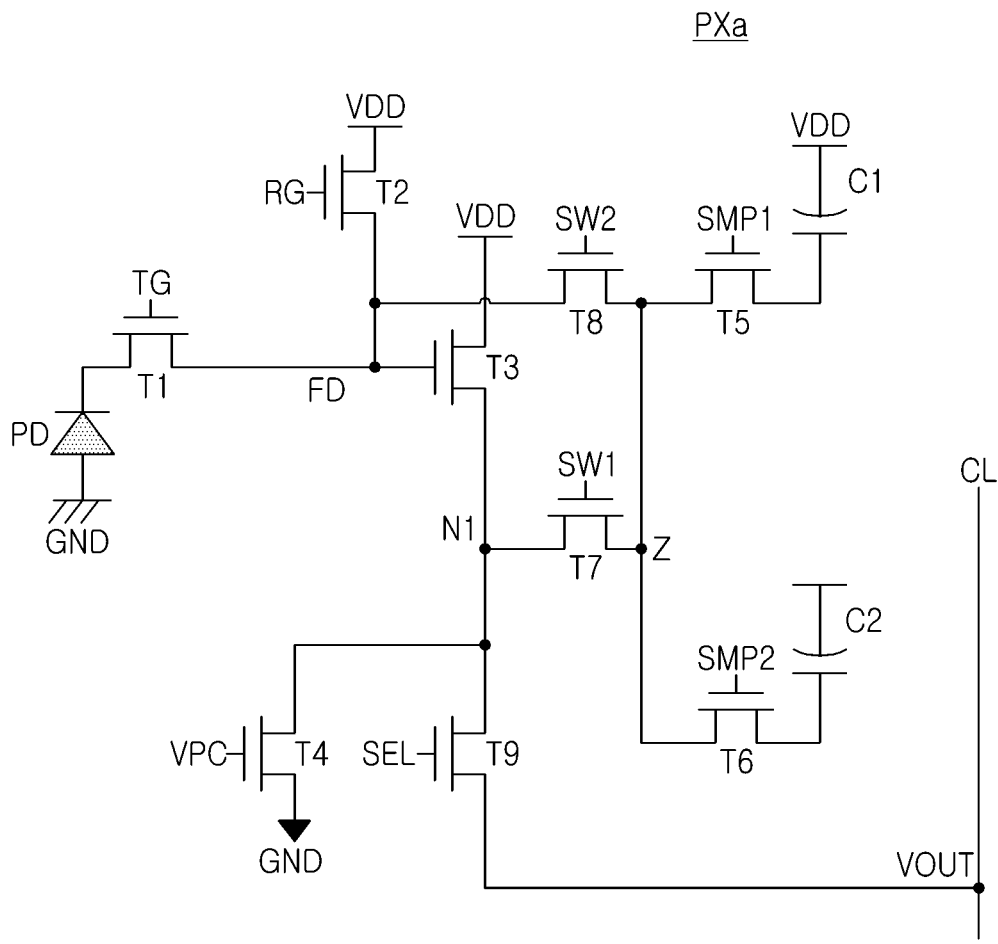
FIG. 7 is a diagram illustrating a pixel according to another example embodiment of the present disclosure.

FIG. 7 is a diagram illustrating a pixel PXa according to another example embodiment of the present disclosure. Referring to FIG. 7, the pixel PXa may further include a ninth transistor T9 (or a select transistor) configured to connect the first node N1 to the corresponding column line CL in response to the select signal SEL, differently from the pixel PX illustrated in FIG. 3. For example, the ninth transistor T9 may be connected between the first node N1 and the column line CL and its gate may receive a select signal SEL. In this case, the fourth transistor T4 may exclusively perform a bias function of the pixel PXa. The voltage VOUT output to the column line CL by the ninth transistor T9 may be a pixel voltage or a reset voltage.

Figure 8:
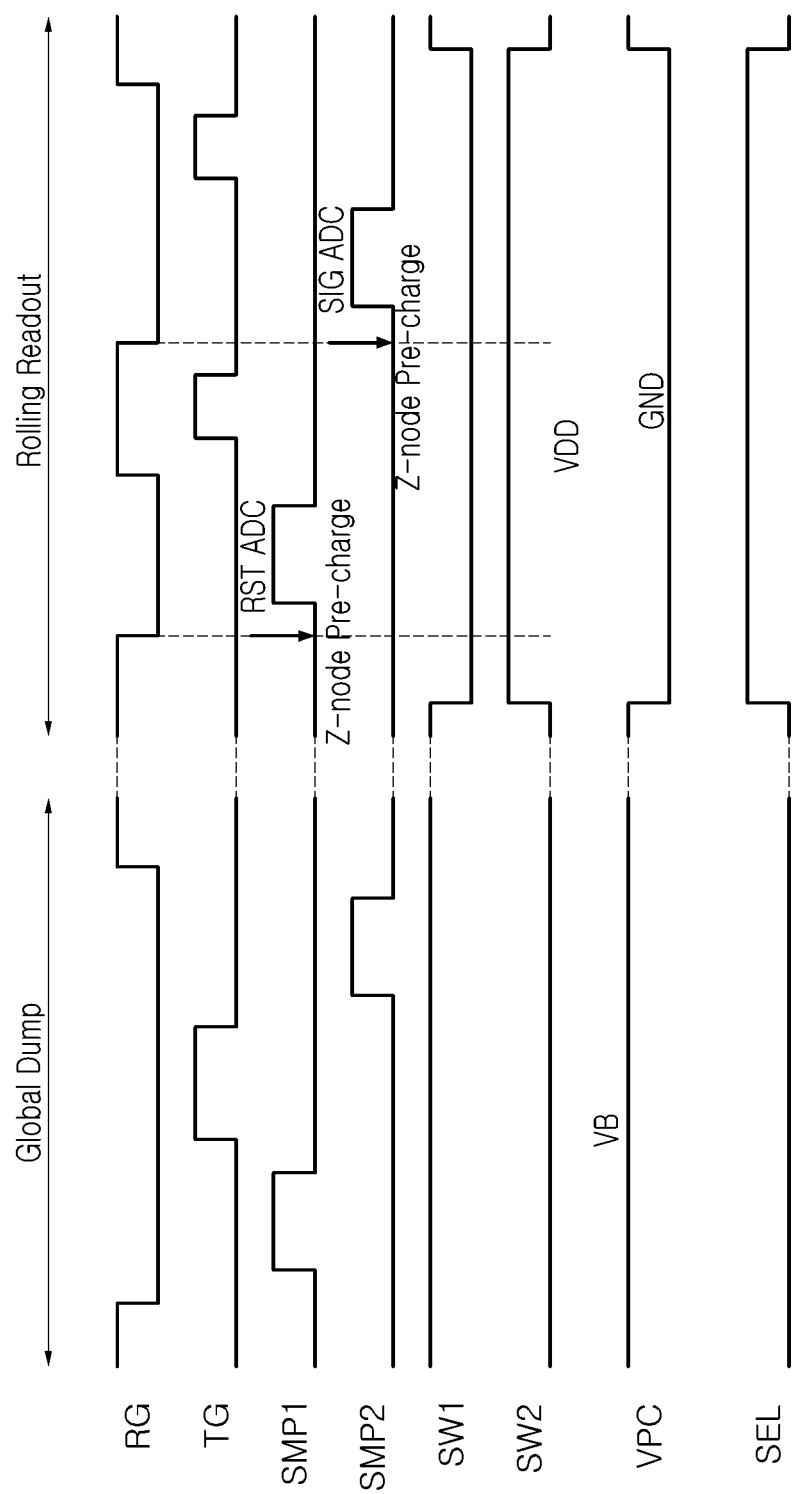
FIG. 8 is a timing diagram illustrating an operation of the pixel illustrated in FIG. 7.

FIG. 8 is a timing diagram illustrating an operation of the pixel PXa illustrated in FIG. 7. Referring to FIG. 8, as for the operation of the pixel PXa, a precharge signal VPC may be different and a select signal SEL may be added, differently from the timing illustrated in FIG. 5. The precharge signal VPC may have the level of the bias voltage VB in the global signal dump operation and may have the level of the ground voltage GND in the rolling readout operation. In addition, the select signal SEL may have a low level in a global signal dump operation and may have a high level in a rolling readout operation. As the ninth transistor T9 is turned on in response to the select signal SEL having a high level in the rolling readout operation, the pixel voltage or the reset voltage amplified to the first node N1 may be transferred to the corresponding column line CL.

The pixel in an example embodiment of the present disclosure may be implemented with a three-capacitor structure for 2PD operation.

Figure 9:
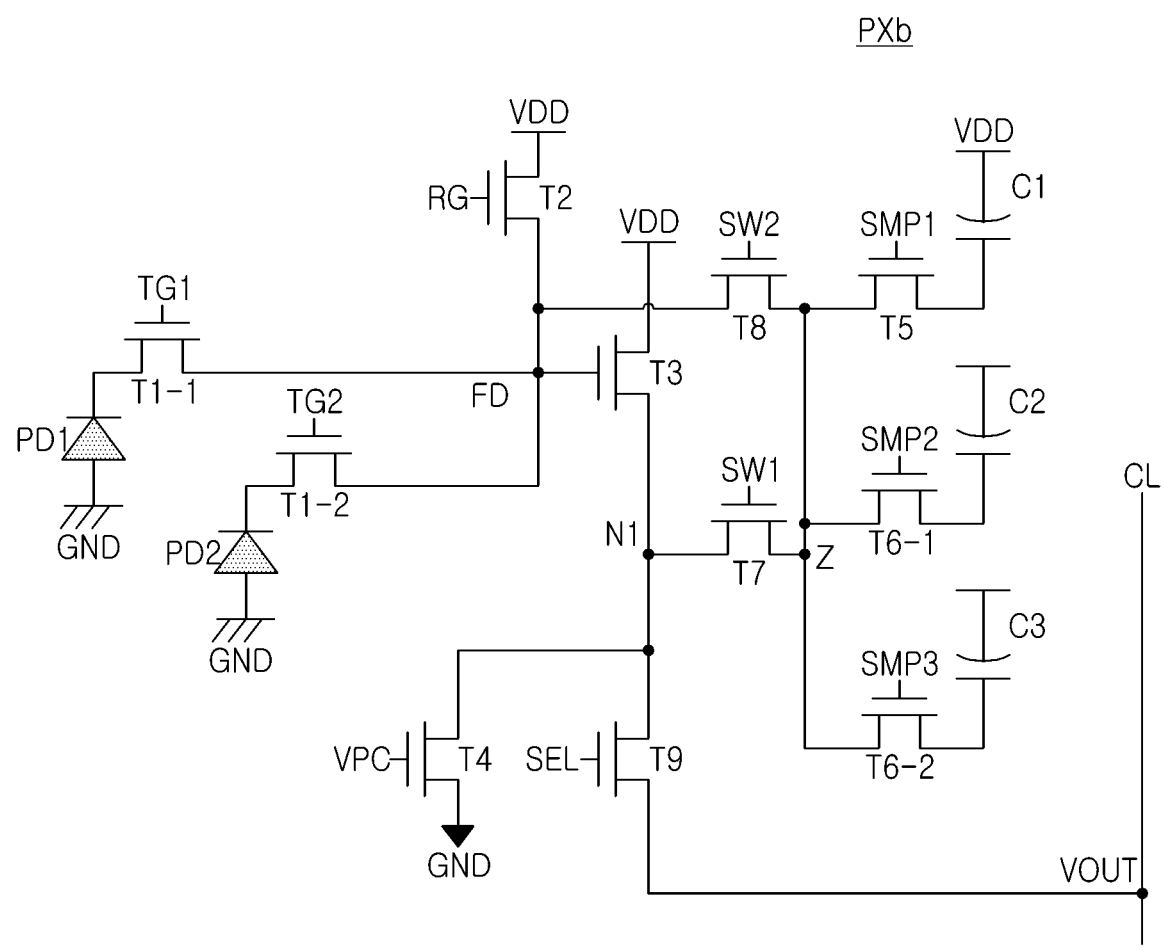
FIG. 9 is a diagram illustrating a pixel according to another example embodiment of the present disclosure.

FIG. 9 is a diagram illustrating a pixel PXb according to another example embodiment of the present disclosure. Referring to FIG. 9, the pixel PXb may include a transistor T1-1 (or a first transfer transistor) connected to the first photodiode PD1, a transistor T1-2 (or a second transfer transistor) connected to a second photodiode PD2, a second capacitor C2 for storing a first pixel voltage corresponding to the first photodiode PD1, a third capacitor C3 for storing the second pixel voltage corresponding to the second photodiode PD2, a transistor T6-1 (or a second sampling transistor) connecting the feedback node Z to the second capacitor C2, and a transistor T6-2 (or a third sampling transistor) connecting the feedback node Z to the third capacitor C3, differently from the pixel PXa illustrated in FIG. 7. In FIG. 9, the first transfer transistor T1-1 receives a first transfer signal TG1 at its gate, and the second transfer transistor T1-2 receives a second transfer signal TG2 at its gate. In addition, the third sampling transistor T6-2 receives a third sampling signal SMP3 at its gate.

Figure 10:
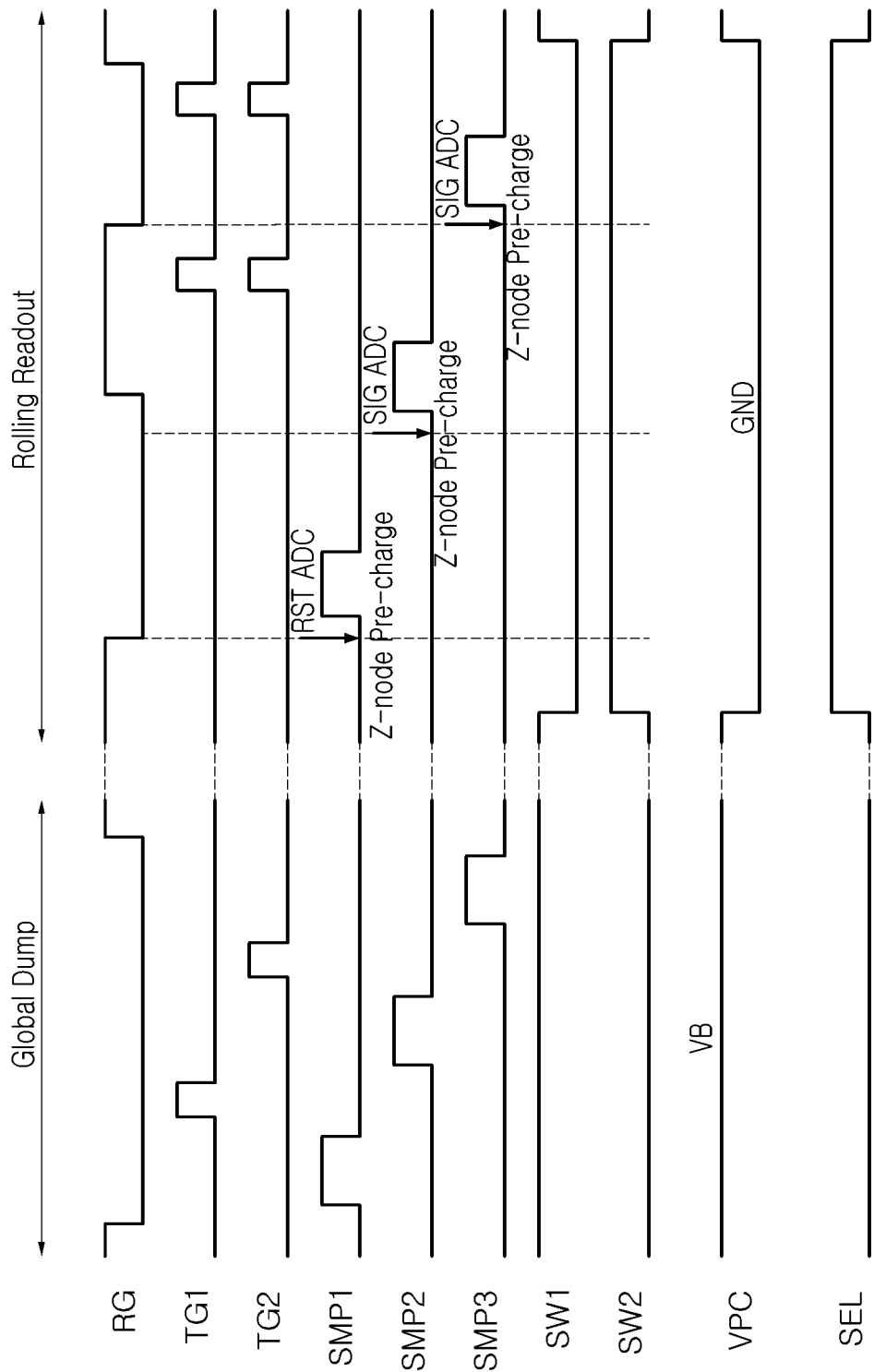
FIG. 10 is a timing diagram illustrating an operation of the pixel illustrated in FIG. 9.

FIG. 10 is a timing diagram illustrating an operation of the pixel PXb illustrated in FIG. 9. Referring to FIG. 10, the operation of the pixel PXb may add the second transfer signal TG2 and the third sampling signal SMP2, differently from the timing illustrated in FIG. 8. In FIG. 10, a third analog-to-digital conversion operation SIG ADC may be performed in response to the third sampling signal SMP2 have a high level in a rolling readout operation.

The pixel in an example embodiment of the present disclosure may further include a capacitor which may be selectively used according to an illuminance environment (high illuminance/low illuminance).

Figure 11:
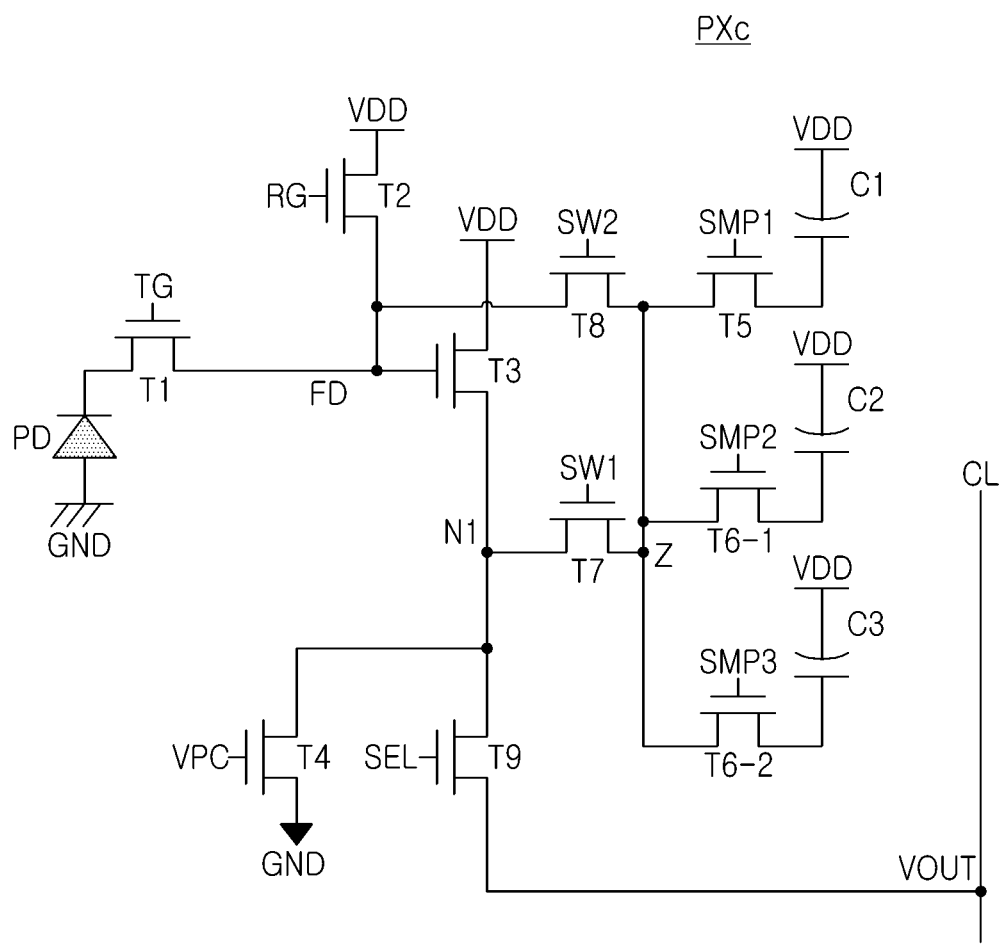
FIG. 11 is a diagram illustrating a pixel according to another example embodiment of the present disclosure; D

FIG. 11 is a diagram illustrating a pixel PXc according to another example embodiment of the present disclosure. Referring to FIG. 11, the pixel PXc may include a third capacitor C3 (or a third storage unit) for additionally storing the pixel voltage at a high luminance, and a transistor T6-2 (or a third sampling transistor) connected to a floating node Z, differently from the pixel PXa illustrated in FIG. 7.

In an example embodiment of the present disclosure, the pixel PXc may store the pixel voltage in the second capacitor C2 by the sampling transistor T6-1 when the illuminance value is low in the global signal dump operation. In an example embodiment of the present disclosure, the pixel PXc may store the pixel voltage in the third capacitor C3 by the sampling transistor T6-2 when the illuminance value is high in the global signal dump operation. In this case, a capacity of the third capacitor C3 may be greater than a capacity of the second capacitor C2.

In another example embodiment of the present disclosure, the pixel PXc may store the pixel voltage in the two capacitors C2 and C3 by the sampling transistors T6-1 and T6-2 when the luminance is high.

The pixel in an example embodiment of the present disclosure may be implemented with an infrared (IR) sensor structure.

Figure 12A:
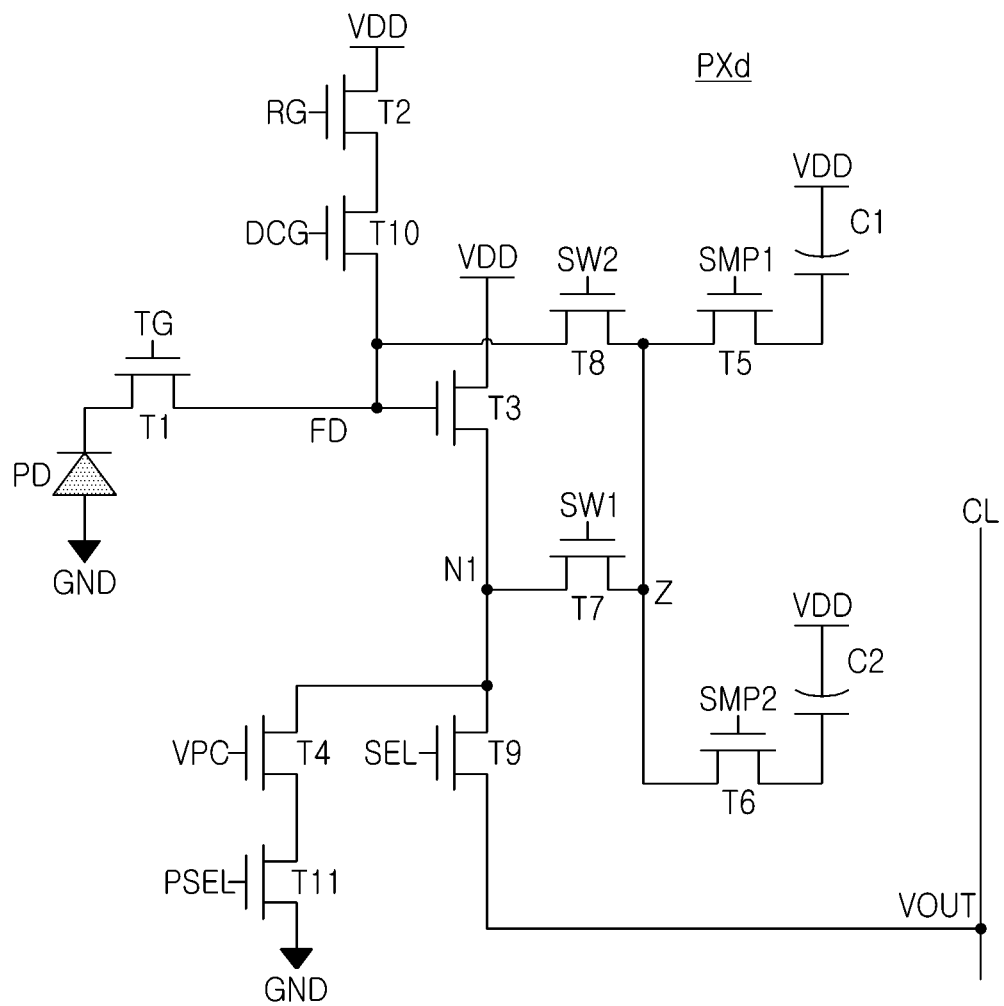
FIG. 12A is a diagram illustrating an infrared (IR) pixel according to an example embodiment of the present disclosure.
Figure 12B:
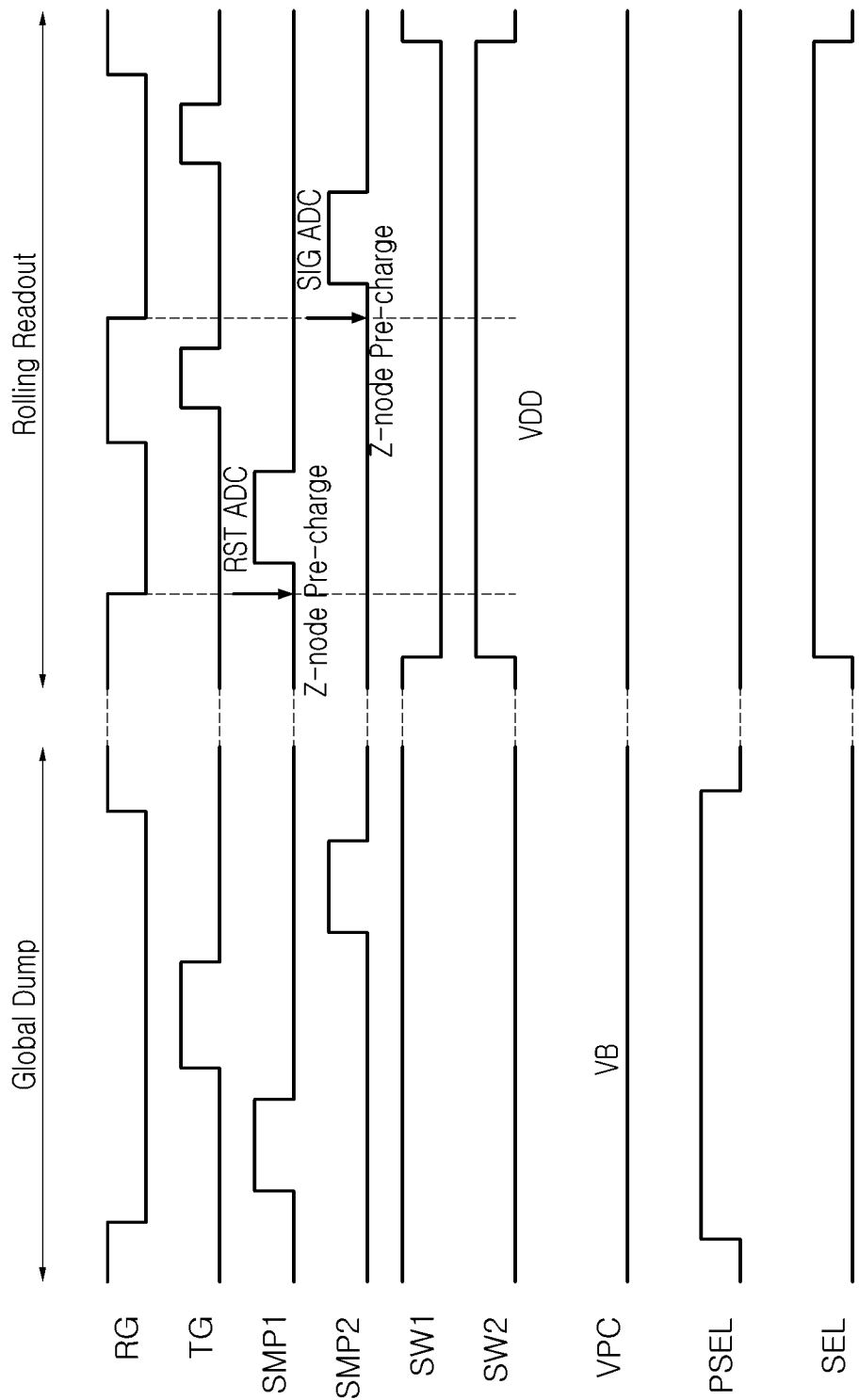
FIG. 12B is a diagram illustrating an operation timing of an IR pixel according to an example embodiment of the present disclosure.

FIG. 12A is a diagram illustrating an IR pixel PXd according to an example embodiment of the present disclosure. FIG. 12B is a diagram illustrating an operation timing of an IR pixel according to an example embodiment of the present disclosure.

Referring to FIG. 12A, the IR pixel PXd may have a structure in which a conversion gain transistor T10 and a precharge select transistor T11 are further included, differently from the pixel PXa illustrated in FIG. 7. The conversion gain transistor T10 (or tenth transistor) may be provided between the second transistor T2 and the floating diffusion node FD. The precharge select transistor T11 (or eleventh transistor) may be connected to a terminal of the fourth transistor T4.

The conversion gain transistor T10 may be turned on in response to a conversion gain signal DCG. For example, when the illuminance value is a high illuminance, the conversion gain signal DGC may have a high level state. Accordingly, the conversion gain transistor T10 may increase a capacity of the floating diffusion node FD in a high illuminance situation.

The precharge select transistor T11 may be turned on in response to the precharge select signal PSEL.

Referring to FIG. 12B, the precharge signal VPC and the precharge select signal PSEL may be added to the operation of the IR pixel PXd, differently from the timing illustrated in FIG. 8. The precharge signal VPC may have a level of the bias voltage VB in the global signal dump operation and the rolling readout operation. In an example embodiment of the present disclosure, the bias voltage VB may be around 0.4V. However, the bias voltage VB in an example embodiment of the present disclosure is not limited thereto. The precharge transistor T4 may always maintain a turned-on state by the precharge signal VPC having the bias voltage VB. In addition, the precharge select signal PSEL may have a high level in a global signal dump operation and may have a low level in a rolling readout operation. As described above, by isolating the bias function of the signal dump operation and the precharge selection function of the readout operation, biasing may be stably maintained in the operation of the IR pixel PXd. In FIG. 12A, a capacity of the floating diffusion node FD may increase by a single conversion gain transistor T10. However, an example embodiment of the present disclosure is not limited thereto. For example, a capacity of the floating diffusion node FD may be varied depending on the environment by adding a plurality of transistors.

Figure 13:
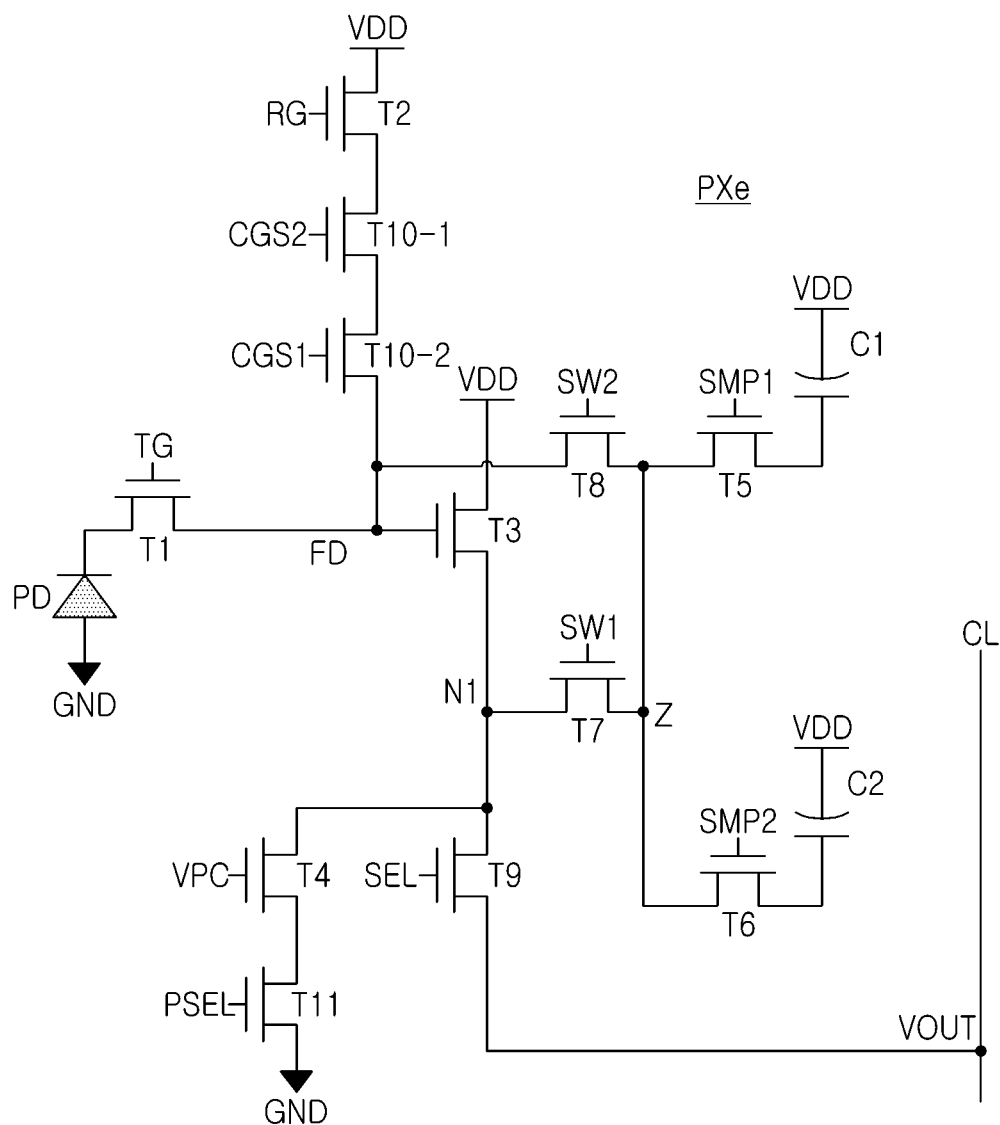
FIG. 13 is a diagram illustrating a pixel according to another example embodiment of the present disclosure.

FIG. 13 is a diagram illustrating a pixel PXe according to another example embodiment of the present disclosure. Referring to FIG. 13, the pixel PXe may have a structure in which conversion gain transistors T10-1 and T10-2 connected to each other in series may be further included, differently from the example in FIG. 12A. The conversion gain transistors T10-1 and T10-2 may be turned on in response to the corresponding conversion gain signals CGS1 and CGS2, thereby changing the capacity of the floating diffusion node FD.

A plurality of pixels connected to regions in which row lines intersect column lines in an example embodiment of the present disclosure may be implemented as a single pixel group having various color patterns.

FIG. 14A is a diagram illustrating a pixel configured in a 2×2 Bayer pattern. FIG. 14B is a diagram illustrating a pixel configured in a 4×4 tetra pattern. FIG. 14C is a diagram illustrating a pixel configured in a 8×8 Q-cell pattern. FIG. 14D is a diagram illustrating a pixel including an infrared light (IR) sub-pixel.

The Bayer pattern illustrated in FIGS. 14A, 14B, 14C and 14D may include a red sub-pixel R, a blue sub-pixel B, and a green sub-pixel G. However, the Bayer pattern in an example embodiment of the present disclosure is not limited thereto. The Bayer pattern in an example embodiment of the present disclosure may be configured in various manners by appropriately disposing the red sub-pixel R, the blue sub-pixel B, the green sub-pixel G, or a white sub-pixel W.

A pixel group in an example embodiment of the present disclosure may include lenses of various sizes.

Figure 15A:
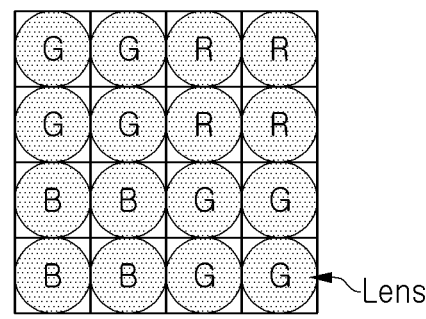
FIG. 15A is a diagram illustrating a tetra pixel having a lens corresponding to each color sub-pixel.
Figure 15B:
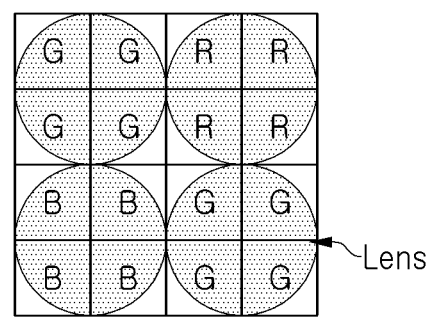
FIG. 15B is a diagram illustrating a tetra pixel including a lens corresponding to four same color sub-pixels.
Figure 15C:
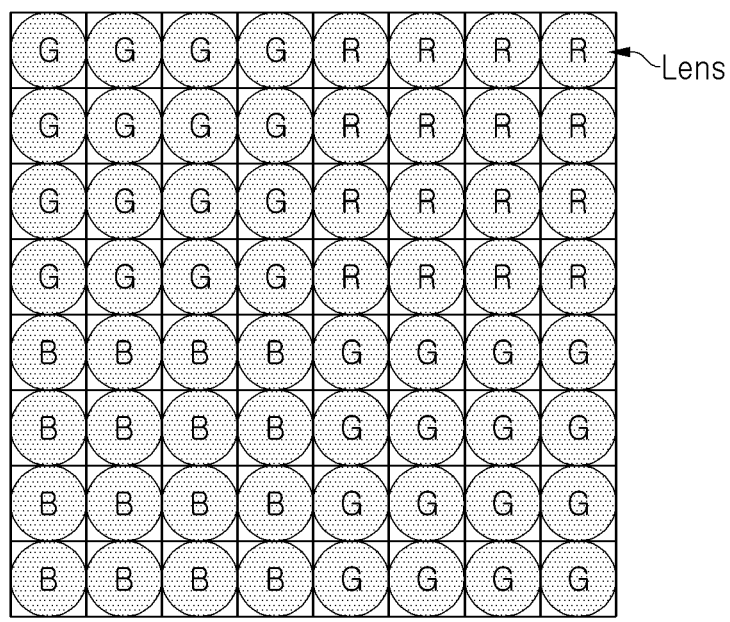
FIG. 15C is a diagram illustrating a 4×4 color filter pixel including a lens corresponding to a 1×1 sub-pixel.
Figure 15D:
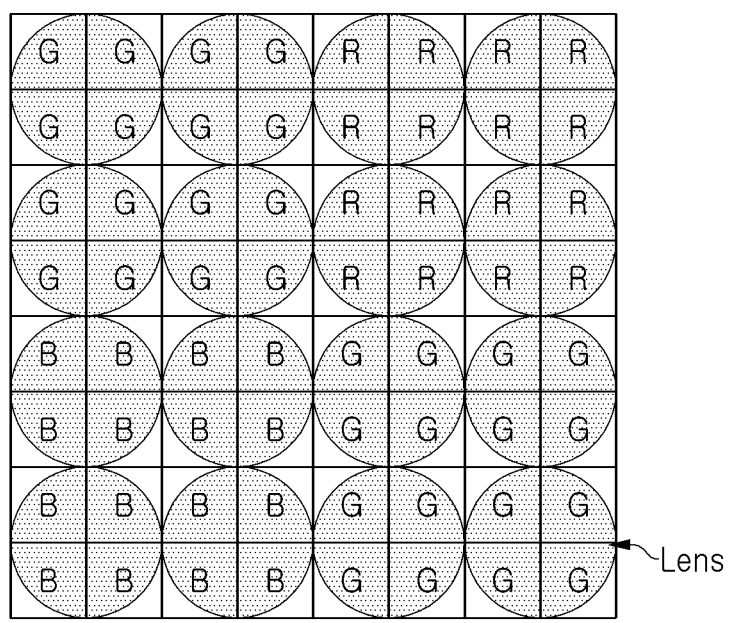
FIG. 15D is a diagram illustrating a 4×4 color filter pixel corresponding to a 2×2 sub-pixel.
Figure 15E:
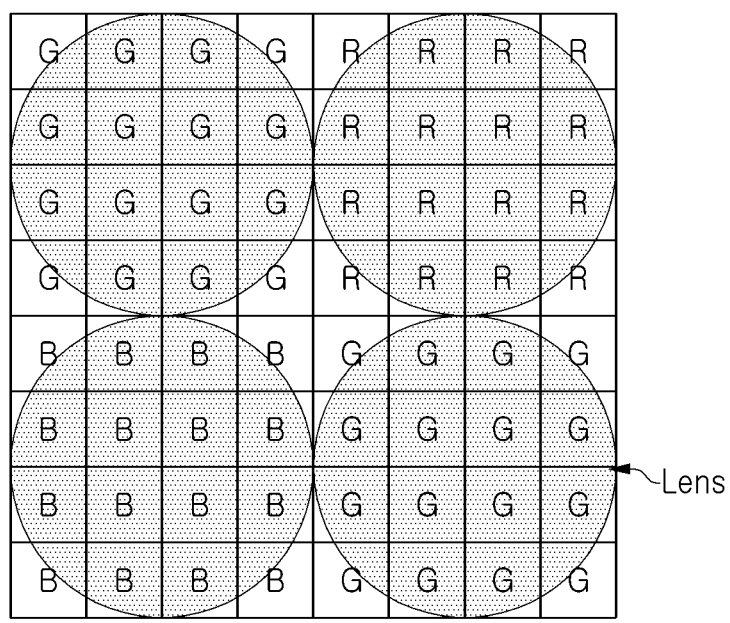
FIG. 15E is a diagram illustrating a 4×4 color filter pixel corresponding to a 4×4 sub-pixel.

FIG. 15A is a diagram illustrating a tetra pixel having a lens corresponding to each color sub-pixel. FIG. 15B is a diagram illustrating a tetra pixel including a lens corresponding to four same color sub-pixels. FIG. 15C is a diagram illustrating a 4×4 color filter pixel including a lens corresponding to a 1×1 sub-pixel. FIG. 15D is a diagram illustrating a 4×4 color filter pixel corresponding to a 2×2 sub-pixel. FIG. 15E is a diagram illustrating 4×4 color filter pixel corresponding to a 4×4 sub-pixel.

The sizes of the color filter pixels and lenses corresponding thereto illustrated in FIGS. 15A, 15B, 15C, 15D, and 15E are merely examples. In other words, the present disclosure is not limited thereto.

A pixel in an example embodiment of the present disclosure may be implemented in a 2-PD structure sharing a single floating diffusion region.

Figure 16A:
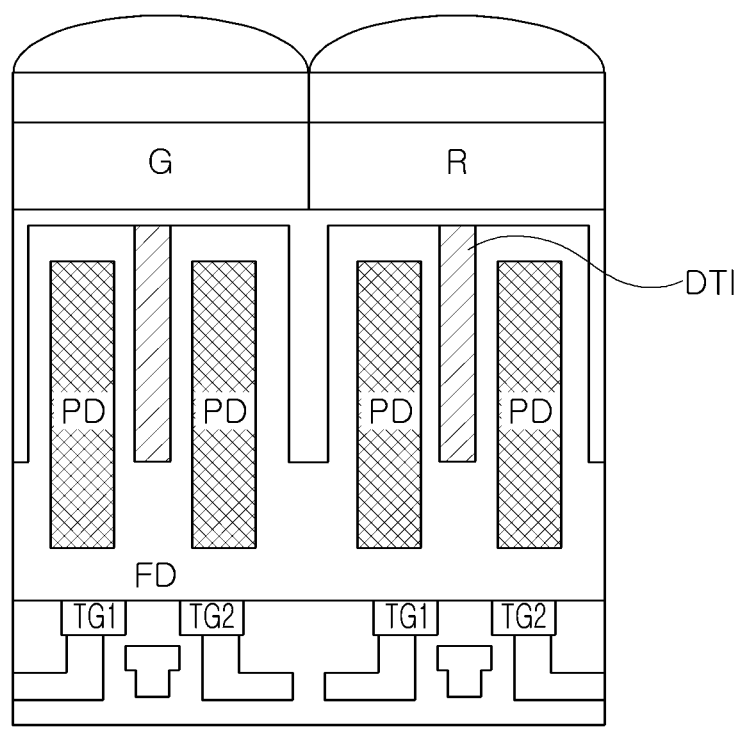
FIGS. 16A and 16B are diagrams illustrating pixels having a 2-PD structure.
Figure 16B:
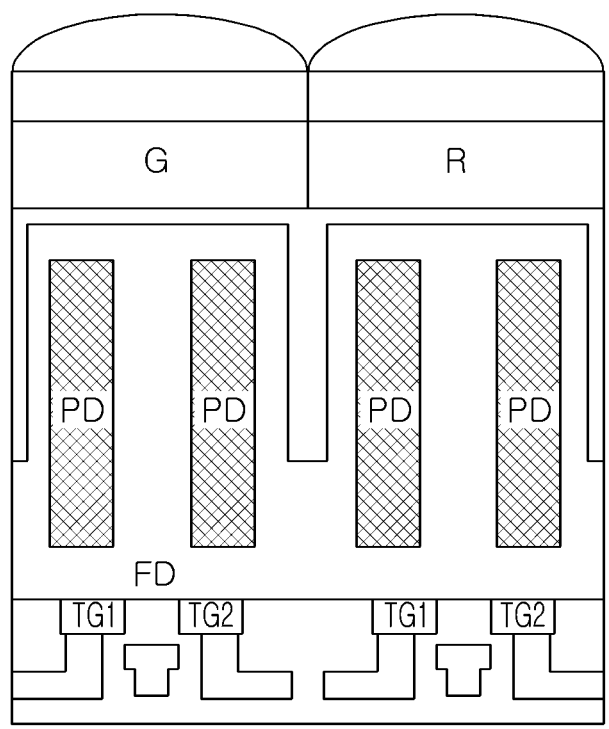

FIGS. 16A and 16B are diagrams illustrating pixels having a 2-PD structure. Referring to FIG. 16A, the 2-PD pixel may isolate the left PD from the right PD by in-pixel deep trench isolation (DTI), and referring to FIG. 16B, the 2-PD pixel may isolate the left PD from the right PD by a PN junction.

The floating diffusion region FD may be connected to a pair of left and right PDs disposed in the pixel in common. In other words, a first floating diffusion region may be connected to four photoelectric conversion elements in common. The floating diffusion region FD may include, for example, N-type impurities. The first and second transfer gates TG1 and TG2 disposed on the substrate of the first pixel and the first and second transfer gates TG1 and TG2 disposed on the substrate of the second pixel may share the floating diffusion region FD.

A plurality of pixel groups connected to a point at which row lines intersect column lines in an example embodiment of the present disclosure may be disposed. Each of the plurality of pixel groups may include a plurality of pixels. In this case, the sizes of the pixels of the pixel group may be different.

Figure 17A:
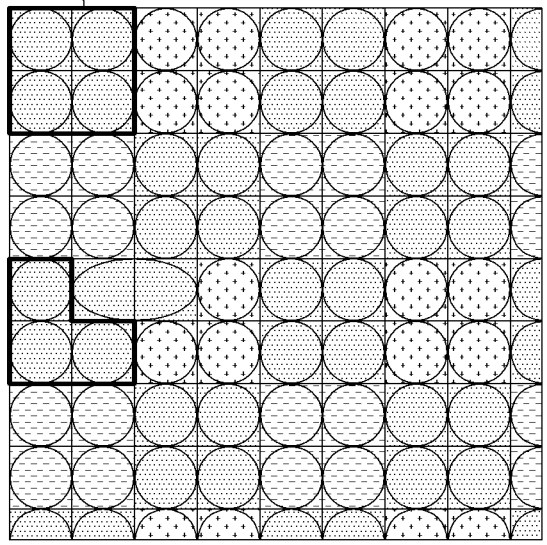
FIGS. 17A and 17B are diagrams illustrating pixel groups implemented in different sizes.
Figure 17B:
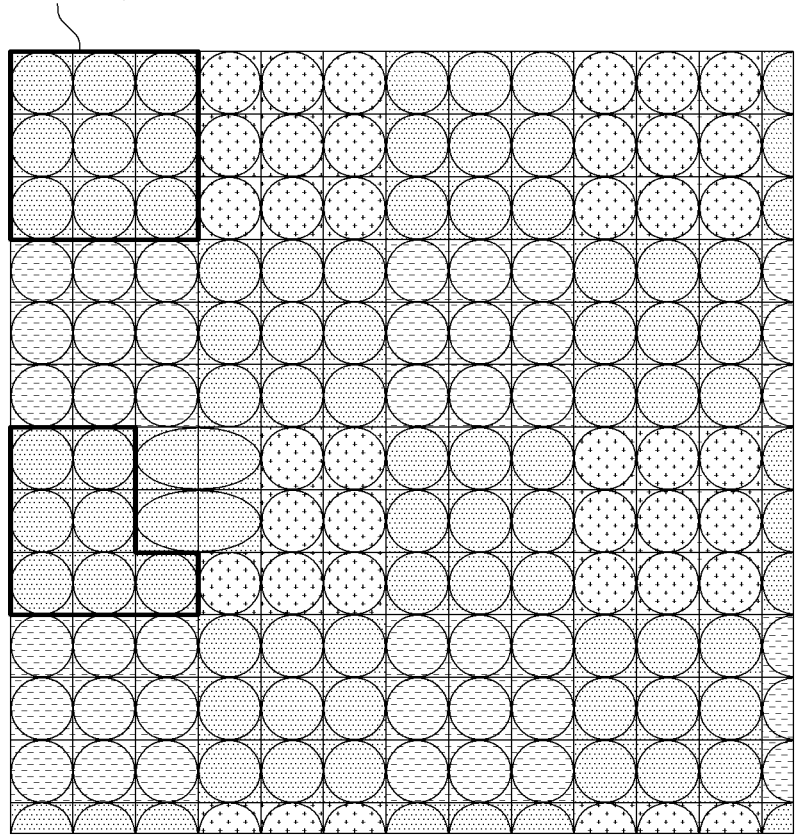

FIGS. 17A and 17B are diagrams illustrating pixel groups implemented in different sizes. Referring to FIG. 17A, a Bayer pattern implemented with pixels having the same size and a Bayer pattern having at least one pixel having a different size are illustrated. Referring to FIG. 17B, a tetra pattern implemented with pixels having the same size and a tetra pattern having at least one pixel having a different size are illustrated.

Figure 18:
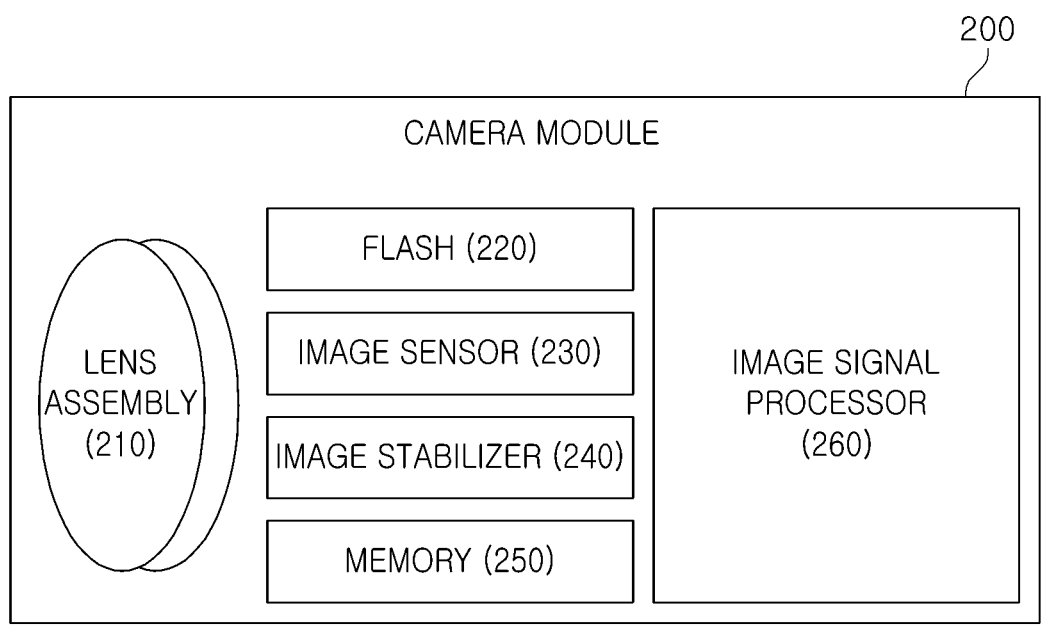
FIG. 18 is a diagram illustrating an imaging device according to an example embodiment of the present disclosure.

FIG. 18 is a diagram illustrating an imaging device 200 according to an example embodiment of the present disclosure. Referring to FIG. 18, the imaging device 200 may include a lens assembly 210, a flash 220, an image sensor 230, an image stabilizer 240, a buffer memory 250, or an image signal processor 260.

The lens assembly 210 may collect light emitted from a subject to be imaged. The lens assembly 210 may include one or more lenses. In an example embodiment of the present disclosure, the imaging device 200 may include a plurality of lens assemblies 210. In this case, the imaging device 200 may form, for example, a dual camera, a 360 degree camera, or a spherical camera. A portion of the plurality of lens assemblies 210 may have the same lens properties (e.g., field of view (FoV), focal length, auto focus, f-number, or optical zoom), or at least one lens assembly may have one or more lens properties different from the lens properties of the different lens assembly. The lens assembly 210 may include, for example, a wide-angle lens or a telephoto lens.

The flash 220 may emit light used to enhance light emitted or reflected from the subject. In an example embodiment of the present disclosure, the flash 220 may include one or more light emitting diodes (e.g., a red-green-blue (RGB) LED, a white LED, an infrared LED, or an ultraviolet (UV) LED) or a xenon lamp. The image sensor 230 may obtain an image corresponding to the subject by converting light emitted or reflected from the subject and transmitted through the lens assembly 210 into an electrical signal. In an example embodiment of the present disclosure, the image sensor 230 may include an image sensor selected from among image sensors having different properties, such as an RGB sensor, a black and white (BW) sensor, an IR sensor, or a UV sensor, a plurality of image sensors having the same properties, or a plurality of image sensors having different properties. The image sensor 230 may be implemented as the pixels or the image sensor having the same described with reference to FIGS. 1 to 17. In an example embodiment of the present disclosure, resolutions of the plurality of image sensors may be the same or different. The different resolutions of each of the plurality of image sensors may indicate that the number of pixels included in each of the plurality of image sensors is different. For example, a first image sensor of the plurality of image sensors may include 120,000 pixels, and a second image sensor of the plurality of image sensors may include 80,000 pixels (the number of pixels is 3:2 as a ratio). In this case, when the camera module 180 includes five image signal processors (ISPs), the image frame data of the first image sensor may be processed by the first ISP to the third ISP among the five ISPs, and the image frame data of the second image sensor may be processed by the fourth ISP to the fifth ISP among the five ISPs.

In an example embodiment of the present disclosure, when the second image sensor does not operate and only the first image sensor operates, image frame data of the first image sensor may be processed based on all five ISPs. In an example embodiment of the present disclosure, the plurality of image sensors may output different types of image frame data. For example, the plurality of image sensors may output image frame data of different colors. For example, the first image sensor may be a color image sensor, and the second image sensor may be a black-and-white image sensor. In this case, the image frame data of the first image sensor may request more processing such as "color interpolation" and "white balance" than the image frame data of the second image sensor. Therefore, when the first image sensor and the second image sensor have the same resolution and the imaging device 200 includes five ISPs, four ISPs among the five ISPs may process image frame data of the first image sensor, and the other ISP may process image frame data of the second image sensor.

The image stabilizer 240 may move at least one lens or the image sensor 230 included in the lens assembly 210 in a specific direction in response to the movement of the imaging device 200 or an electronic device including the same, or may control operation characteristics of the image sensor 230 (e.g., adjusting read-out timing), and this operation may compensate for at least a portion of negative effects of the movement on the image taken. In an example embodiment of the present disclosure, the image stabilizer 240 may sense the movements of the imaging device 200 or the electronic device using a gyro sensor or an acceleration sensor disposed internally or externally of the imaging device 200. In an example embodiment of the present disclosure, the image stabilizer 240 may be implemented as an optical image stabilizer, for example.

The memory 250 may temporarily store at least a portion of the image obtained through the image sensor 230 for a subsequent image processing operation. For example, when image acquisition is delayed according to the shutter or a plurality of images are obtained at high speed, the obtained original image (e.g., a Bayer-patterned image or a high-resolution image) may be stored in the memory 250 and, a copy image corresponding thereto (e.g., a low-resolution image) may be previewed through a display device. Thereafter, when a specified condition is satisfied (e.g., a user input or a system command), at least a portion of the original image stored in the memory 250 may be obtained and processed by the image signal processor 260, for example. In an example embodiment of the present disclosure, the memory 250 may be configured as at least a portion of the memory 130 or as a memory operated independently.

The image signal processor 260 may perform one or more image processing operations on an image obtained through the image sensor 230 or an image stored in the memory 250. One or more image processing may include generating a depth map, 3D modeling, creating a panorama, extracting feature points, synthesizing an image, or compensating an image (e.g., reducing noise, adjusting resolution, adjusting brightness, blurring, sharpening, or softening. Additionally or alternatively, the image signal processor 260 may perform control on at least one of the components included in the imaging device 200 (e.g., an image sensor (230)). The image processed by the image signal processor 260 may be stored back in the memory 250 for further processing and may be provided as an external component of the imaging device 200.

Figure 19:
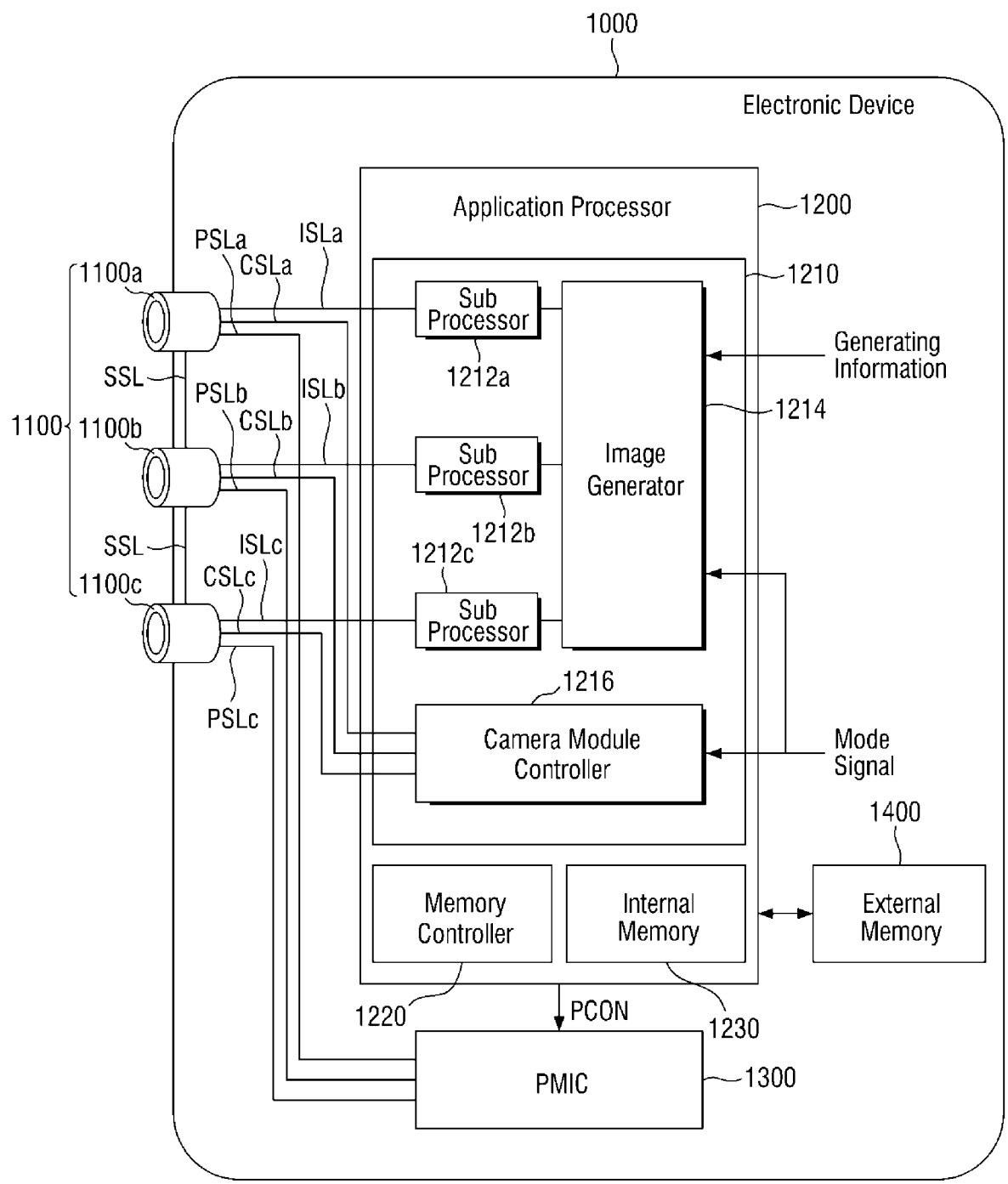
FIG. 19 is a diagram illustrating an electronic device having a multi-camera module according to an example embodiment of the present disclosure.

FIG. 19 is a diagram illustrating an electronic device having a multi-camera module according to an example embodiment of the present disclosure. Referring to FIG. 19, an electronic device 1000 may include a camera module group 1100, an application processor 1200, a power management integrated circuit (PMIC) 1300, and an external memory (also referred to as storage) 1400.

The camera module group 1100 may include a plurality of camera modules 1100a, 1100b, and 1100c. Although FIG. 19 illustrates an example embodiment of the present disclosure in which three camera modules 1100a, 1100b, and 1100c are disposed, the present disclosure is not limited thereto. In an example embodiment of the present disclosure, the camera module group 1100 may be modified to include only two camera modules. In addition, in an example embodiment of the present disclosure, the camera module group 1100 may be modified to include n (n is a natural number equal to or greater than 4) camera modules.

Figure 20:
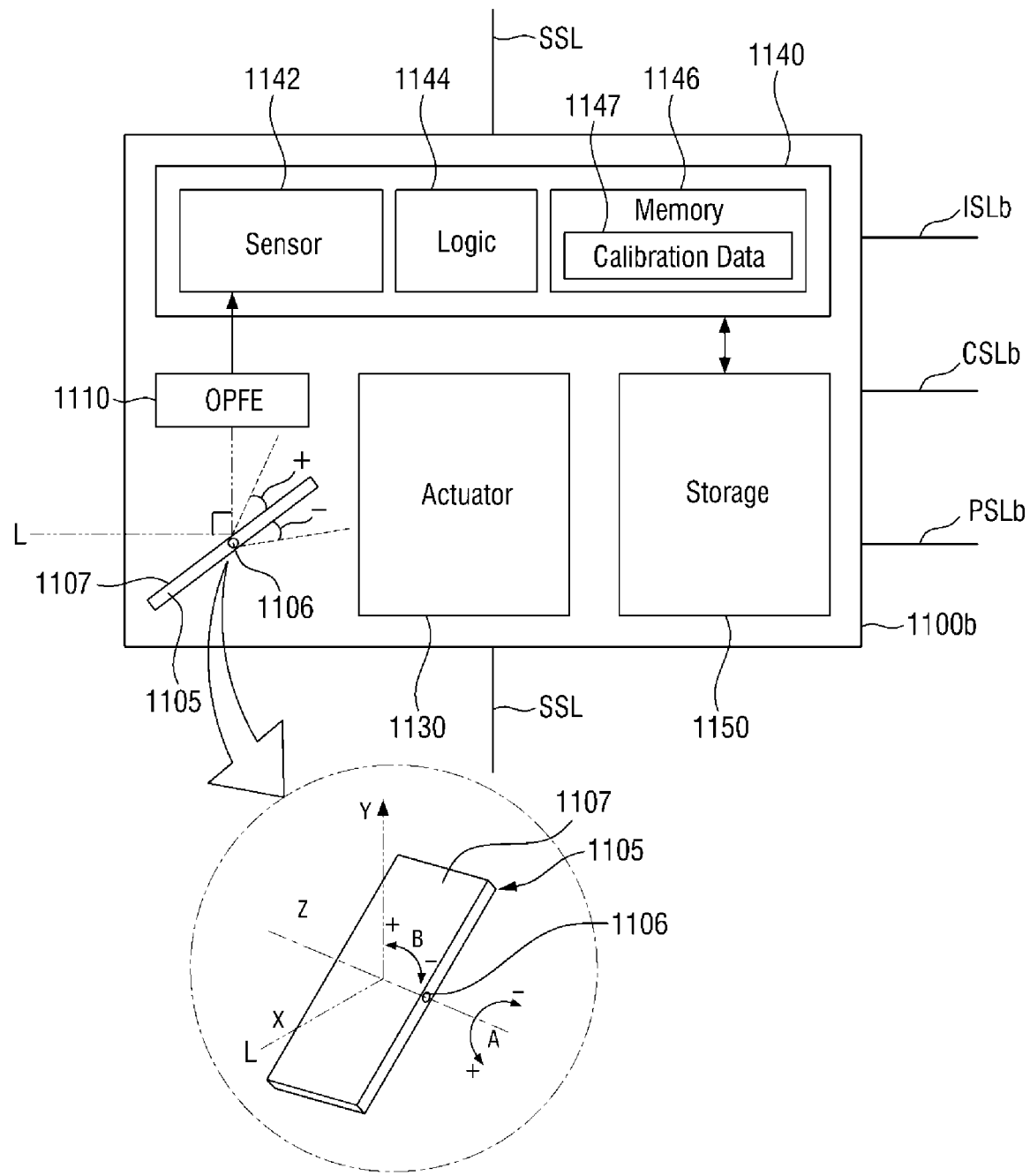
FIG. 20 is a diagram illustrating a detailed configuration of a camera module illustrated in FIG. 19.

FIG. 20 is a diagram illustrating a detailed configuration of a camera module 1100b illustrated in FIG. 19. The description below will also be applied to the other camera modules 1100a and 1100c in example embodiments of the present disclosure. Referring to FIG. 20, the camera module 1100b may include a prism 1105, an optical path folding element 1110 (hereinafter, "OPFE"), an actuator 1130, an imaging device 1140, and a storage unit 1150.

The prism 1105 may include a reflective surface 1107 of a light reflective material to modify the path of light L incident from the outside. In example embodiments of the present disclosure, the prism 1105 may change the path of light L incident in the first direction X to be directed in the second direction Y perpendicular to the first direction X. In addition, the prism 1105 may rotate the reflective surface 1107 of the light reflective material in the A direction about a central axis 1106 or may rotate the central axis 1106 in the B direction such that the path of the light L incident in the first direction (X) may change to be directed in the second vertical direction Y. In this case, the OPFE 1110 may also move in a third direction (Z) perpendicular to the first direction (X) and the second direction (Y). In example embodiments of the present disclosure, as illustrated, a maximum rotation angle of the prism 1105 in the A direction may be 15 degrees or less in the positive (+) A direction, and may be greater than 15 degrees in the negative (−) A direction, but the present disclosure is not limited thereto. In example embodiments of the present disclosure, the prism 1105 may move in a positive (+) or negative (−) B direction by around 20 degrees, or between 10 degrees and 20 degrees, or between 15 degrees and 20 degrees, and as for the moving angle, the prism 1105 may move by the same angle in the positive (+) or negative (−) B direction or may move by a similar angle in a range of about 1 degree. In example embodiments of the present disclosure, the prism 1105 may move the reflective surface 1106 of a light reflective material in a third direction (e.g., the Z direction) parallel to the extending direction of the central axis 1106.

The OPFE 1110 may include, for example, an optical lens including m (where m is a natural number) number of lenses. The m number of lenses may move in the second direction Y to change an optical zoom ratio of the camera module 1100b. For example, when a basic optical zoom ratio of the camera module 1100b is Z, and m number of optical lenses included in the OPFE 1110 move, the optical zoom ratio of the camera module 1100b may be 3Z, 5Z, or 5Z or higher.

The actuator 1130 may move the OPFE 1110 or an optical lens (hereinafter, referred to as an optical lens) to a specific position. For example, the actuator 1130 may adjust the position of the optical lens such that an image sensor 1142 may be disposed at a focal length of the optical lens for accurate sensing.

The imaging device 1140 may include the image sensor 1142, a control logic 1144 and a memory 1146. The image sensor 1142 may sense an image of a sensing target using light L provided through an optical lens. The control logic 1144 may control the overall operation of the camera module 1100b. For example, the control logic 1144 may control the operation of the camera module 1100b according to a control signal provided through a control signal line CSLb.

The memory 1146 may store information necessary for operation of the camera module 1100b, such as calibration data 1147. The calibration data 1147 may include information necessary for the camera module 1100b to generate image data using light L provided by the outside. The calibration data 1147 may include, for example, information on a degree of rotation, information on a focal length, information on an optical axis, and the like, described above. When the camera module 1100b is implemented as a multi-state camera of which a focal length changes depending on the position of the optical lens, the calibration data 1147 may include information on focal length values for each position (or each state) of the optical lens and autofocusing.

The storage unit 1150 may store image data sensed through the image sensor 1142. The storage unit 1150 may be disposed externally on the image sensing device 1140 and may be implemented to be stacked with a sensor chip forming the image sensing device 1140. In example embodiments of the present disclosure, the storage unit 1150 may be implemented as an electrically erasable programmable read-only memory (EEPROM), but the present disclosure is not limited thereto.

Referring to FIGS. 19 and 20 together, in example embodiments of the present disclosure, each of the plurality of camera modules 1100a, 1100b, and 1100c may include an actuator 1130. Accordingly, each of the plurality of camera modules 1100a, 1100b, and 1100c may include the same or different calibration data 1147 according to the operation of the actuator 1130 included therein. In example embodiments of the present disclosure, one camera module (e.g., 1100b) among the plurality of camera modules 1100a, 1100b, and 1100c may be implemented as a folded lens type camera module including the prism 1105 and OPFE 1110 described above, and the other camera modules (e.g., 1100a and 1100c) may be a vertical type camera module which does not include the prism 1105 and OPFE 1110, but the present disclosure is not limited thereto.

In example embodiments of the present disclosure, one camera module (e.g., 1100c) among the plurality of camera modules 1100a, 1100b, and 1100c may be implemented as a vertical-type depth camera which may extract depth information using infrared ray (IR), for example. In this case, the application processor 1200 may merge the image data provided by the depth camera with the image data provided by another camera module (e.g., the camera module 1100a or 1100c) and may generate a 3D depth image. In example embodiments of the present disclosure, at least two camera modules (e.g., 1100a and 1100b) among the plurality of camera modules 1100a, 1100b, and 1100c may have different fields of view. In this case, for example, the optical lenses of at least two camera modules (e.g., 1100a and 1100b) among the plurality of camera modules 1100a, 1100b, and 1100c may be different from each other, but the present disclosure is not limited thereto. In addition, in example embodiments of the present disclosure, fields of view of the plurality of camera modules 1100a, 1100b, and 1100c may be different from each other. In this case, the optical lenses included in each of the plurality of camera modules 1100a, 1100b, and 1100c may also be different from each other, but the present disclosure is not limited thereto. In example embodiments of the present disclosure, the plurality of camera modules 1100a, 1100b, and 1100c may be configured to be physically isolated from each other. In other words, a sensing area of one image sensor 1142 may not be divided and used by the plurality of camera modules 1100a, 1100b, and 1100c, and an independent image sensor 1142 may be disposed in each of the plurality of camera modules 1100a, 1100b, and 1100c.

Referring back to FIG. 19, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented to be separated from each other as separate semiconductor chips. The image processing device 1210 may include a plurality of sub-image processors 1212a, 1212b, and 1212c, an image generator 1214, and a camera module controller 1216. The image processing device 1210 may include a plurality of sub-image processors 1212a, 1212b, and 1212c corresponding to the number of the plurality of camera modules 1100a, 1100b, and 1100c.

Image data generated by each of the camera modules 1100a, 1100b, and 1100c may be provided to corresponding sub-image processors 1212a, 1212b, and 1212c through image signal lines ISLa, ISLb, and ISLc separated from each other. For example, image data generated by the camera module 1100a may be provided to the sub-image processor 1212a through an image signal line ISLa, the image data generated by the camera module 1100b may be provided to the sub-image processor 1212b through the image signal line ISLb, and the image data generated by the camera module 1100c may be provided to the sub-image processor 1212c through the image signal line ISLc. The image data transmission may be performed using, for example, a camera serial interface (CSI) based on a mobile industry processor interface (MIPI), but the present disclosure is not limited thereto.

In example embodiments of the present disclosure, one sub-image processor may be arranged to correspond to a plurality of camera modules. For example, the sub-image processor 1212a and the sub-image processor 1212c may not be implemented to be separated from each other as illustrated, and may be implemented to be integrated into a single sub-image processor, and the image data provided by the camera module 1100a and the camera module 1100c may be selected through a selection device (e.g., a multiplexer) and may be provided to the integrated sub-image processor. The image data provided to each of the sub-image processors 1212a, 1212b, and 1212c may be provided to the image generator 1214. The image generator 1214 may generate an output image using the image data provided by each of the sub-image processors 1212a, 1212b, and 1212c according to image generating information or a mode signal. For example, the image generator 1214 may generate an output image by merging at least portions of the image data generated by the camera modules 1100a, 1100b, and 1100c having different fields of view according to the image generating information or a mode signal. In addition, the image generator 1214 may generate an output image by selecting one of the image data generated by the camera modules 1100a, 1100b, and 1100c having different fields of view according to image generation information or a mode signal.

In example embodiments of the present disclosure, the image generating information may include a zoom signal or a zoom factor. In addition, in example embodiments of the present disclosure, the mode signal may be, for example, a signal based on a mode selected by a user. When the image generating information is a zoom signal (zoom factor), and the camera modules 1100a, 1100b, and 1100c have different fields of view, the image generator 1214 may perform different operations depending on types of zoom signals. For example, when the zoom signal is a first signal, the image data output by the camera module 1100a may be merged with the image data output by the camera module 1100c, and an output image may be generated using the merged image signal and the image data output by the camera module 1100b which has not been used in the merging. When the zoom signal is a second signal different from the first signal, the image generator 1214 may not perform the image data merging, and may generate an output image by selecting one of the image data output by each camera module 1100a, 1100b, and 1100c. However, the present disclosure is not limited thereto, and a method of processing the image data may be varied if desired.

In example embodiments of the present disclosure, the image generator 1214 may receive a plurality of image data having different exposure times from at least one of the plurality of sub-image processors 1212a, 1212b, and 1212c, and may perform high dynamic range (HDR) processing thereon, such that merged image data with an increased dynamic range may be generated. At least one of the plurality of sub-image processors 1212a, 1212b, and 1212c may distribute a digital clock when performing an analog operation in at least one of the camera modules 1100a, 1100b, and 1100c, as described in FIGS. 1 to 10.

The camera module controller 1216 may provide a control signal to each of the camera modules 1100a, 1100b, and 1100c. The control signal generated by the camera module controller 1216 may be provided to corresponding camera modules 1100a, 1100b, and 1100c through control signal lines CSLa, CSLb, and CSLc separated from each other. In addition, one of the plurality of camera modules 1100a, 1100b, and 1100c may be designated as a master camera (e.g., 1100b) according to image generating information including a zoom signal, or a mode signal, and the other camera modules (e.g., 1100a and 1100c) may be designated as slave cameras. The above-described information may be included in a control signal and may be provided to corresponding camera modules 1100a, 1100b, and 1100c through control signal lines CSLa, CSLb, and CSLc separated from each other.

Camera modules operating as masters and slaves may change according to a zoom factor or an operating mode signal. For example, when the field of view of the camera module 1100a is wider than that of the camera module 1100b, and the zoom factor exhibits a low zoom ratio, the camera module 1100b may operate as a master, and the camera module 1100a may operate a slave. Conversely, when the zoom factor exhibits a high zoom ratio, the camera module 1100a may operate as a master and the camera module 1100b may operate as a slave.

In example embodiments of the present disclosure, a control signal provided by the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit a sync enable signal to the camera module 1100b. The camera module 1100b receiving the sync enable signal may generate a sync signal on the basis of the provided sync enable signal, and may transmit the generated sync signal to the camera modules 1100a and 1100c. The camera module 1100b and the camera modules 1100a and 1100c may be synchronized with the sync signal and may transmit image data to the application processor 1200.

In example embodiments of the present disclosure, a control signal provided by the camera module controller 1216 to the plurality of camera modules 1100a, 1100b, and 1100c may include mode information according to the mode signal. The plurality of camera modules 1100a, 1100b, and 1100c may operate in a first operating mode and a second operating mode in relation to a sensing speed on the basis of the mode information.

In the first operating mode, the plurality of camera modules 1100a, 1100b, and 1100c may generate an image signal at a first rate (e.g., may generate an image signal at a first frame rate), may encode the image signal at a second rate higher than the first rate (e.g., may encode an image signal of a second frame rate higher than a first frame rate), and may transmit the encoded image signal to the application processor 1200. In this case, the second speed may be 30 times or less of the first speed.

The application processor 1200 may store the received image signal, the encoded image signal, in the memory 1230 provided therein or the storage 1400 disposed externally of the application processor 1200, may read the encoded image signal out from the memory 1230 or the storage 1400, and may display image data generated on the basis of the decoded image signal. For example, a corresponding sub-processor among the plurality of sub-processors 1212a, 1212b, and 1212c of the image processing device 1210 may perform decoding, and may also perform image processing on the decoded image signal.

In the second operating mode, the plurality of camera modules 1100a, 1100b, and 1100c may generate an image signal at a third rate lower than the first rate (e.g., generate an image signal of a third frame rate lower than the first frame rate), and may transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power voltage, to each of the plurality of camera modules 1100a, 1100b, and 1100c. For example, the PMIC 1300 may supply first power to the camera module 1100a through a power signal line PSLa under control of the application processor 1200, may supply second power to the camera module 1100b through a power signal line PSLb, and may supply third power to the camera module 1100c through a power signal line PSLc. The PM1C 1300 may generate power corresponding to each of the plurality of camera modules 1100a, 1100b, and 1100c in response to a power control signal PCON provided from the application processor 1200, and may also adjust a level of power. The power control signal PCON may include a power adjustment signal for each operating mode of the plurality of camera modules 1100a, 1100b, and 1100c. For example, the operating mode may include a low power mode, and in this case, the power control signal PCON may include information on a camera module operating in a low power mode and a determined power level. Levels of power provided to the plurality of camera modules 1100a, 1100b, and 1100c may be the same or different. In addition, a level of power may be dynamically changed.

Figure 21A:
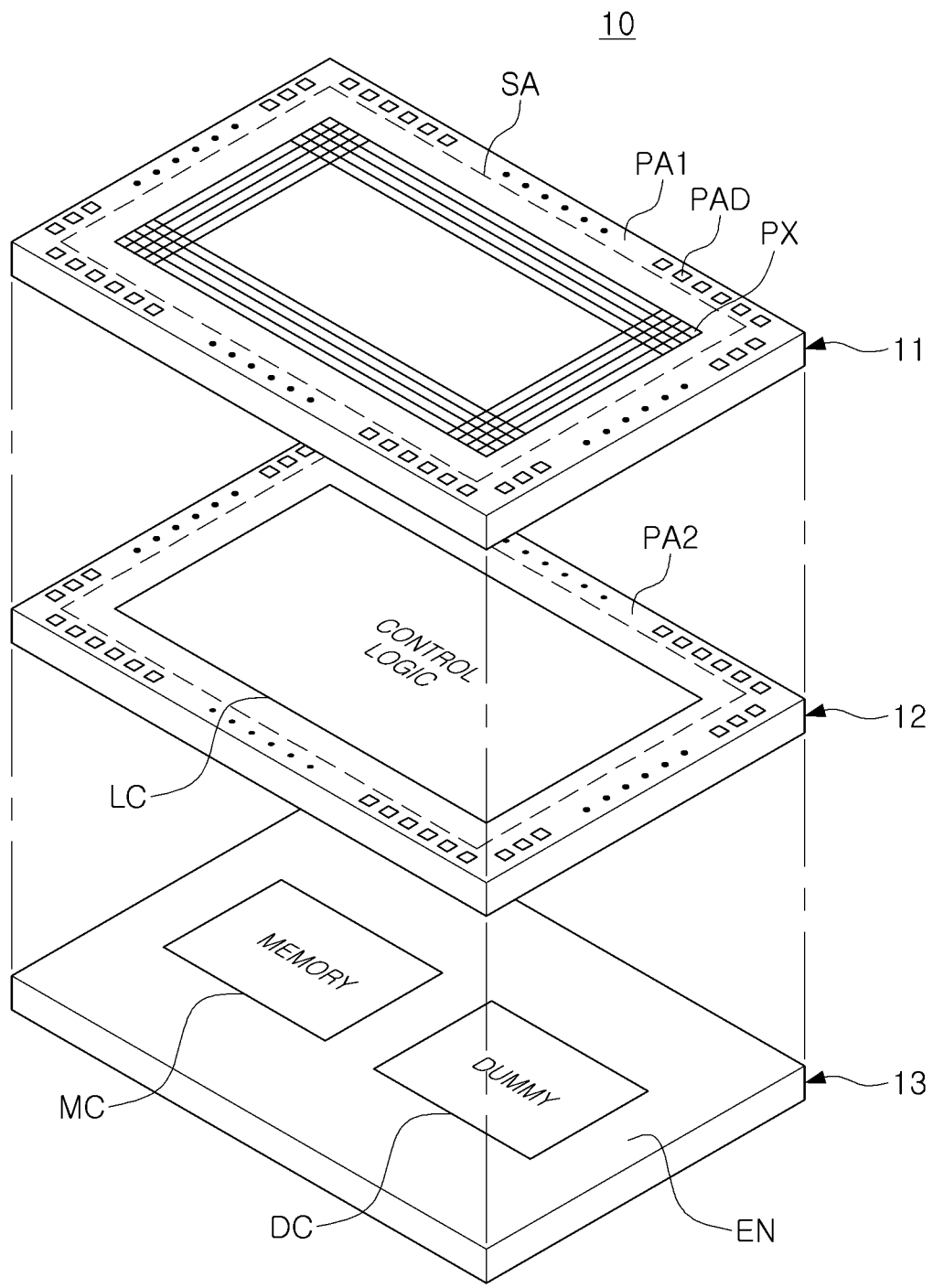
FIGS. 21A and 21B are diagrams illustrating imaging devices according to an example embodiment of the present disclosure.
Figure 21B:
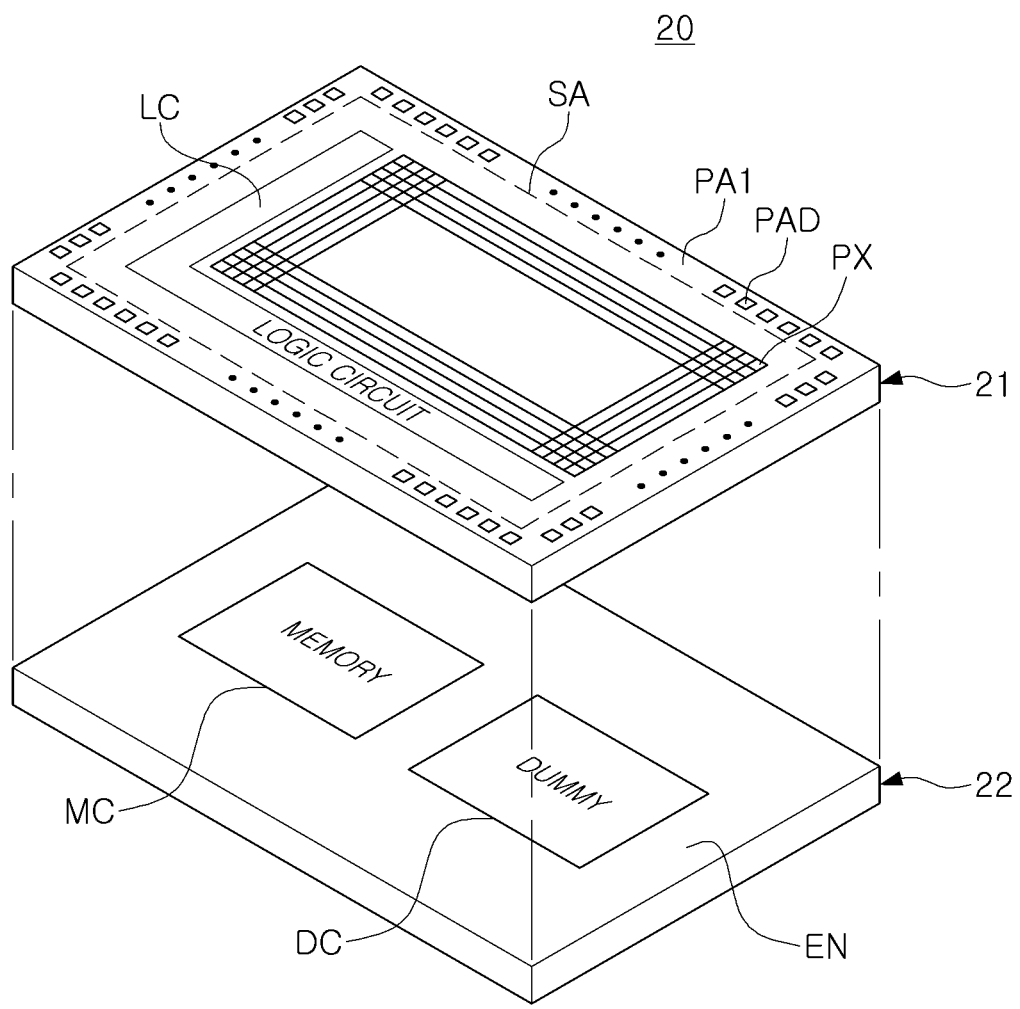

FIGS. 21A and 21B are diagrams illustrating imaging devices according to an example embodiment of the present disclosure. Referring to FIG. 21A, the imaging device 10 in an example embodiment may include a first layer 11, a second layer 12 provided below the first layer 11, and a third layer 13 provided below the second layer 12. The first layer 11, the second layer 12, and the third layer 13 may be stacked in a direction perpendicular to each other. In an example embodiment of the present disclosure, the first layer 11 and the second layer 12 may be stacked on each other at a wafer level, and the third layer 13 may be attached to a lower portion of the second layer 12 on a chip level. The first to third layers 11-13 may be provided as a single semiconductor package. The first layer 11 may include a sensing area SA provided with a plurality of pixels PX and a first pad area PA1 provided around the sensing area SA. The first pad area PA1 may include a plurality of upper pads PAD, and the plurality of upper pads PAD may be connected to pads and a control logic LC provided in the second pad area PA2 of the second layer 12 through a via, or the like.

Each of the plurality of pixels PX may include a photodiode for generating charges by receiving light, and a pixel circuit for processing the charges generated by the photodiode. The pixel circuit may include a plurality of transistors for outputting a voltage corresponding to the charges generated by the photodiode.

The second layer 12 may include a plurality of devices providing the control logic LC. The plurality of devices included in the control logic LC may provide circuits for driving the pixel circuit provided in the first layer 11, such as, for example, a row driver, a column driver, and a timing controller. A plurality of devices included in the control logic LC may be connected to the pixel circuit through the first and second pad regions PA1 and PA2. The control logic LC may generate a pixel signal by obtaining a reset voltage and a pixel voltage from the plurality of pixels PX.

In an example embodiment of the present disclosure, at least one of the plurality of pixels PX may include a plurality of photodiodes disposed on the same level. Pixel signals generated by charges of each of the plurality of photodiodes may have a phase difference with each other, and the control logic LC may provide an autofocus function based on a phase difference between pixel signals generated by the plurality of photodiodes included in one pixel PX.

The third layer 13 provided below the second layer 12 may include a memory chip MC and a dummy chip DC, and a protective layer EN for sealing the memory chip MC and the dummy chip DC. The memory chip MC may be a dynamic random access memory (DRAM) or a static random access memory (SRAM), and the dummy chip DC may not have a function of storing data. The memory chip MC may be electrically connected to at least a portion of the elements included in the control logic LC of the second layer 12 by bumps, and may store information necessary to provide an autofocus function. In an example embodiment of the present disclosure, the bump may be a micro bump.

Referring to FIG. 2I B, the imaging device 20 in another example embodiment of the present disclosure may include a first layer 21 and a second layer 22. The first layer 21 may include a sensing area SA in which a plurality of pixels PX are provided, a control logic LC in which devices for driving the plurality of pixels PX are provided, and a first pad area PA1 arranged around the sensing area SA and the control logic LC. The first pad area PA1 may include a plurality of upper pads PAD, and the plurality of upper pads PAD may be connected to the memory chip MC provided on the second layer 22 through vias. The second layer 22 may include the memory chip MC and the dummy chip DC, and a protective layer EN sealing the memory chip MC and the dummy chip DC.

An image sensor in an example embodiment of the present disclosure may, by including pixels implementing global dump and readout operations by a single source-follower transistor, obtain pixel miniaturization.

According to the aforementioned example embodiments of the present disclosure, the image sensor, the imaging device and a method of operating the same may, by performing a global shutter operation using a single source-follower transistor, greatly reduce the pixel area.

While the example embodiments of the present disclosure have been illustrated and described above, it will be apparent to those skilled in the art that modifications and variations could be made thereto without departing from the scope of the present disclosure as set forth by the appended claims.

What is claimed is:

1. An image sensor, comprising:
a first capacitor;
a second capacitor;
a first transistor connected between a photodiode and a floating diffusion node, and having a gate for receiving a transfer signal;
a second transistor connected between a first power terminal and the floating diffusion node and having a gate for receiving a reset signal;
a third transistor connected between a second power terminal and a first node and having a gate connected to the floating diffusion node;
a fourth transistor connected between the first node and a column line and having a gate for receiving a precharge signal;
a fifth transistor connected between the first capacitor and a feedback node and having a gate for receiving a first sampling signal;
a sixth transistor connected between the second capacitor and the feedback node and having a gate for receiving a second sampling signal;
a seventh transistor connected between the first node and the feedback node and having a gate for receiving a first switch signal; and
an eighth transistor connected between the floating diffusion node and the feedback node and having a gate for receiving a second switch signal.

2. The image sensor of claim 1, wherein a rolling shutter operation is performed by turning off the seventh transistor and the eighth transistor in response to the first and second switch signals.

3. The image sensor of claim 1, wherein, when the seventh transistor is turned on by the first switch signal and the eighth transistor is turned off by the second switch signal, a reset voltage is stored in the first capacitor or a pixel voltage is stored in the second capacitor in a signal dump operation of a global shutter mode.

4. The image sensor of claim 3, wherein, in the signal dump operation, a precharge voltage is a bias voltage.

5. The image sensor of claim 4, wherein, after the reset signal is changed from a high level to a low level, the reset voltage is stored in the first capacitor.

6. The image sensor of claim 5, wherein, after the reset signal maintains the low level and the transfer signal is changed from the high level to the low level, the pixel voltage is stored in the second capacitor.

7. The image sensor of claim 1, wherein, when the seventh transistor is turned off by the first switch signal and the eighth transistor is turned on by the second switch signal, a reset voltage stored in the first capacitor or a pixel voltage stored in the second capacitor is output to the column line in a readout operation of a global shutter mode.

8. The image sensor of claim 7, wherein, in the readout operation, the precharge signal is a power supply voltage.

9. The image sensor of claim 8, wherein, after the feedback node is precharged, the reset voltage is output to the column line.

10. The image sensor of claim 9, wherein, after the first sampling signal is changed from a high level to a low level, and the feedback node is precharged, the reset voltage is output to the column line.

11. An imaging sensor, comprising:
a first capacitor;
a second capacitor;
a first transfer transistor connected between a first photodiode and a floating diffusion node, and having a gate for receiving a first transfer signal;
a second transistor connected between a first power terminal and the floating diffusion node and having a gate for receiving a reset signal;
a third transistor connected between a second power terminal and a first node and having a gate connected to the floating diffusion node;
a fourth transistor connected between the first node and a ground terminal and having a gate for receiving a precharge signal;
a first sampling transistor connected between the first capacitor and a feedback node, and having a gate for receiving a first sampling signal;
a second sampling transistor connected between the second capacitor and the feedback node and having a gate for receiving a second sampling signal;
a seventh transistor connected between the first node and the feedback node and having a gate for receiving a first switch signal;
an eighth transistor connected between the floating diffusion node and the feedback node and having a gate for receiving a second switch signal; and
a ninth transistor connected between the first node and a column line and having a gate for receiving a select signal.

12. The image sensor of claim 11,
wherein, in a signal dump operation of a global shutter mode, the precharge signal is a bias voltage and the select signal has a low level, and
wherein, in a readout operation of the global shutter mode, the precharge signal is a ground voltage, and the select signal has a high level.

13. The image sensor of claim 11, further comprising:
a second transfer transistor connected between a second photodiode and the floating diffusion node and having a gate for receiving a second transfer signal.

14. The image sensor of claim 11, further comprising
a third capacitor; and
a third sampling transistor connected between the third capacitor and the feedback node, and having a gate for receiving a third sampling signal.

15. The image sensor of claim 11, further comprising:
at least one transistor disposed between the second transistor and the floating diffusion node.

16. A method of operating an image sensor, the method comprising:
selecting one of a global shutter operation and a rolling shutter operation;
dumping a reset voltage and a pixel voltage to corresponding capacitors via a source follower transistor in each of pixels of the image sensor when performing the global shutter operation; and reading out the reset voltage and the pixel voltage stored in the capacitors in each of the pixels via the source follower transistor, wherein each of the pixels further comprises:

a precharge transistor connected between a first node and a column line and having a gate for receiving a precharge signal;

a first sampling transistor connected between a first one of the capacitors and a feedback node and having agate for receiving a first sampling signal;

a second sampling transistor connected between a second one of the capacitors and the feedback node and having a gate for receiving a second sampling signal;

a first switch transistor connected between the first node and the feedback node and having a gate for receiving a first switch signal; and a second switch transistor connected between a floating diffusion node and the feedback node and having a gate for receiving a second switch signal.

17. The method of claim 16, further comprising:

isolating the capacitors from the source follower transistor in the rolling shutter operation.

18. The method of claim 16, wherein the dumping a reset voltage and a pixel voltage includes biasing a current flowing through the source follower transistor.

19. The method of claim 16, wherein the reading out the reset voltage and the pixel voltage further includes connecting a gate of the source follower transistor to the feedback node.

20. The method of claim 19, wherein the reading out the reset voltage and the pixel voltage further includes precharging the feedback node.

* * * * *